(12) United States Patent
Kim et al.

(10) Patent No.: US 12,482,711 B2
(45) Date of Patent: Nov. 25, 2025

(54) HALF BRIDGE CERAMIC HERMETIC PACKAGE STRUCTURE

(71) Applicant: Texas Instruments Incorporated, Dallas, TX (US)

(72) Inventors: Kwang-Soo Kim, Sunnyvale, CA (US); Vivek Arora, San Jose, CA (US); Ken Pham, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 538 days.

(21) Appl. No.: 18/078,923

(22) Filed: Dec. 10, 2022

(65) Prior Publication Data

US 2024/0194546 A1 Jun. 13, 2024

(51) Int. Cl.
| | |
|---|---|
| H01L 25/07 | (2006.01) |
| H01L 23/00 | (2006.01) |
| H01L 23/08 | (2006.01) |
| H01L 23/492 | (2006.01) |
| H01L 25/00 | (2006.01) |

(52) U.S. Cl.
CPC ............ *H01L 23/08* (2013.01); *H01L 23/492* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 25/072* (2013.01); *H01L 25/50* (2013.01); *H01L 2224/32221* (2013.01); *H01L 2224/48227* (2013.01); *H01L 2224/73265* (2013.01); *H01L 2224/83* (2013.01); *H01L 2224/85* (2013.01); *H01L 2224/92247* (2013.01)

(58) Field of Classification Search
CPC ....... H01L 23/08; H01L 23/492; H01L 24/32; H01L 24/48; H01L 24/73; H01L 24/83; H01L 24/85; H01L 24/92; H01L 25/072; H01L 25/50; H01L 2224/32221; H01L 2224/48227; H01L 2224/73265; H01L 2224/83; H01L 2224/85; H01L 2224/92247; H01L 24/49
See application file for complete search history.

(56) References Cited

U.S. PATENT DOCUMENTS

| | | |
|---|---|---|
| 2020/0091076 A1 | 3/2020 | Kim et al. |
| 2020/0251415 A1 | 8/2020 | Kim et al. |

*Primary Examiner* — Elias Ullah
(74) *Attorney, Agent, or Firm* — Ronald O. Neerings; Frank D. Cimino

(57) ABSTRACT

An electronic device includes a multilevel ceramic body, first, second, and third plates, and first and second semiconductor dies, with the multilevel ceramic body having opposite first and second sides, a first and second openings in the first side, a third opening in the second side, and a ceramic separator structure defining first and second interior portions between the first and second openings. The first plate is attached to the first side and covers the first opening, the second plate is attached to the first side and covers the second opening, the third plate is attached to the second side and covers the third opening, the first semiconductor die is in the first interior portion, and the second semiconductor die is in the second interior portion of the ceramic body.

20 Claims, 23 Drawing Sheets

HALF BRIDGE CERAMIC HERMETIC PACKAGE STRUCTURE

BACKGROUND

Electronic devices operating in space applications must withstand harsh environmental conditions and packaging solutions are limited to accommodate limitations on heat dissipation due to no thermal convection with only conduction and radiation. Moreover, space applications increasingly call for more circuitry in electronic devices as well as higher power density and higher power ratings.

SUMMARY

In one aspect, an electronic device includes a multilevel ceramic body having opposite first and second sides, a first opening in the first side, a second opening in the first side, a third opening in the second side, and a ceramic separator structure between the first and second openings, the ceramic separator defining first and second interior portions of the ceramic body. The electronic device includes a first plate attached to the first side and covering the first opening, a second plate attached to the first side and covering the second opening, a third plate attached to the second side and covering the third opening, a first semiconductor die in the first interior portion of the ceramic body between the first and third plates, and a second semiconductor die in the second interior portion of the ceramic body between the second and third plates.

In another aspect, a multilevel ceramic body includes opposite first and second sides, laterally opposite third and fourth sides spaced apart from one another along a first direction, laterally opposite fifth and sixth sides spaced apart from one another along a second direction that is orthogonal to the first direction, a first opening in the first side, a second opening in the first side, the second opening spaced apart from the first opening along the first direction, a third opening in the second side, and a ceramic separator structure extending along the second direction between the fifth and sixth sides and between the first and second openings.

In a further aspect, a method of fabricating an electronic device includes attaching a first plate to cover a first opening in a first side of a multilevel ceramic body, attaching a second plate to cover a second opening in the first side of the multilevel ceramic body, attaching leads to respective conductive pads on a second side of the ceramic body, attaching a first semiconductor die in a first interior portion of the ceramic body above the first plate, attaching a second semiconductor die in a second interior portion of the ceramic body above the second plate, electrically connecting a first component of the first semiconductor die and a second component of the second semiconductor die in a circuit, and attaching a third plate to cover a third opening in the second side of the multilevel ceramic body.

DETAILED DESCRIPTION

Figure 1:
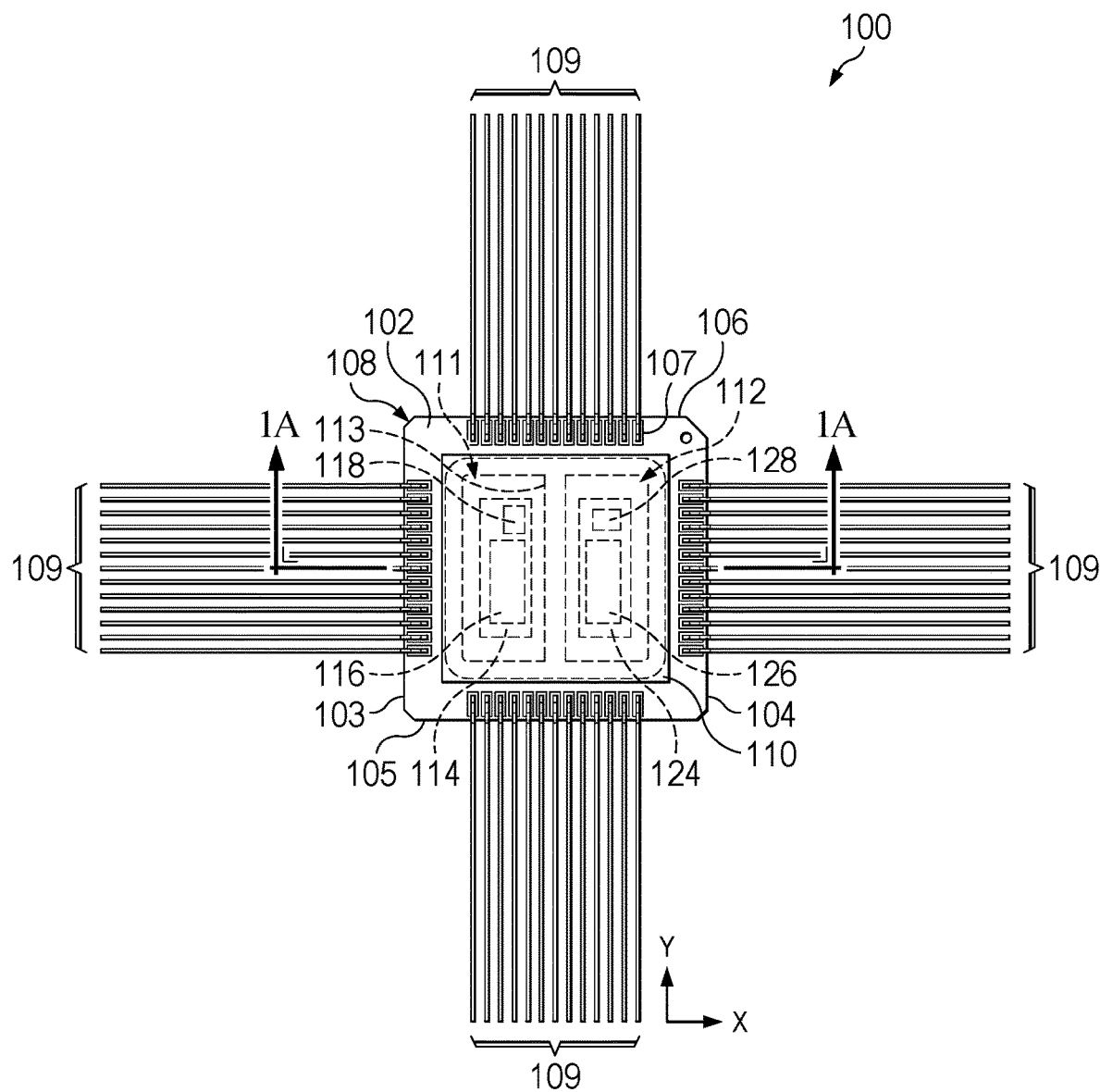
FIG. 1 is a top plan view of an electronic device with a multilevel ceramic structure having two bottom side openings and a separator structure.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. Unless otherwise stated, "about," "approximately," or "substantially" preceding a value means+/−10 percent of the stated value. One or more operational characteristics of various circuits, systems and/or components are hereinafter described in the context of functions which in some cases result from configuration and/or interconnection of various structures when circuitry is powered and operating. One or more operational characteristics of various circuits, systems and/or components are hereinafter described in the context of functions which in some cases result from configuration and/or interconnection of various structures when circuitry is powered and operating.

Figure 1A:
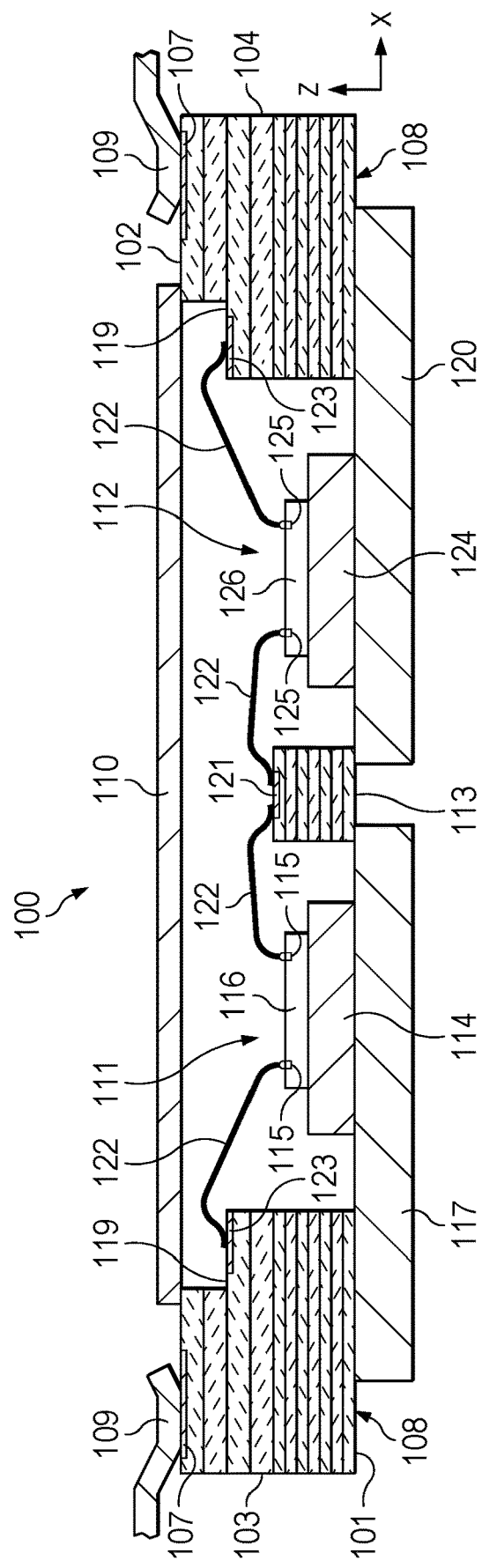
FIG. 1A is a partial sectional side elevation view of the electronic device taken along line 1A-1A in FIG. 1.
Figure 1B:
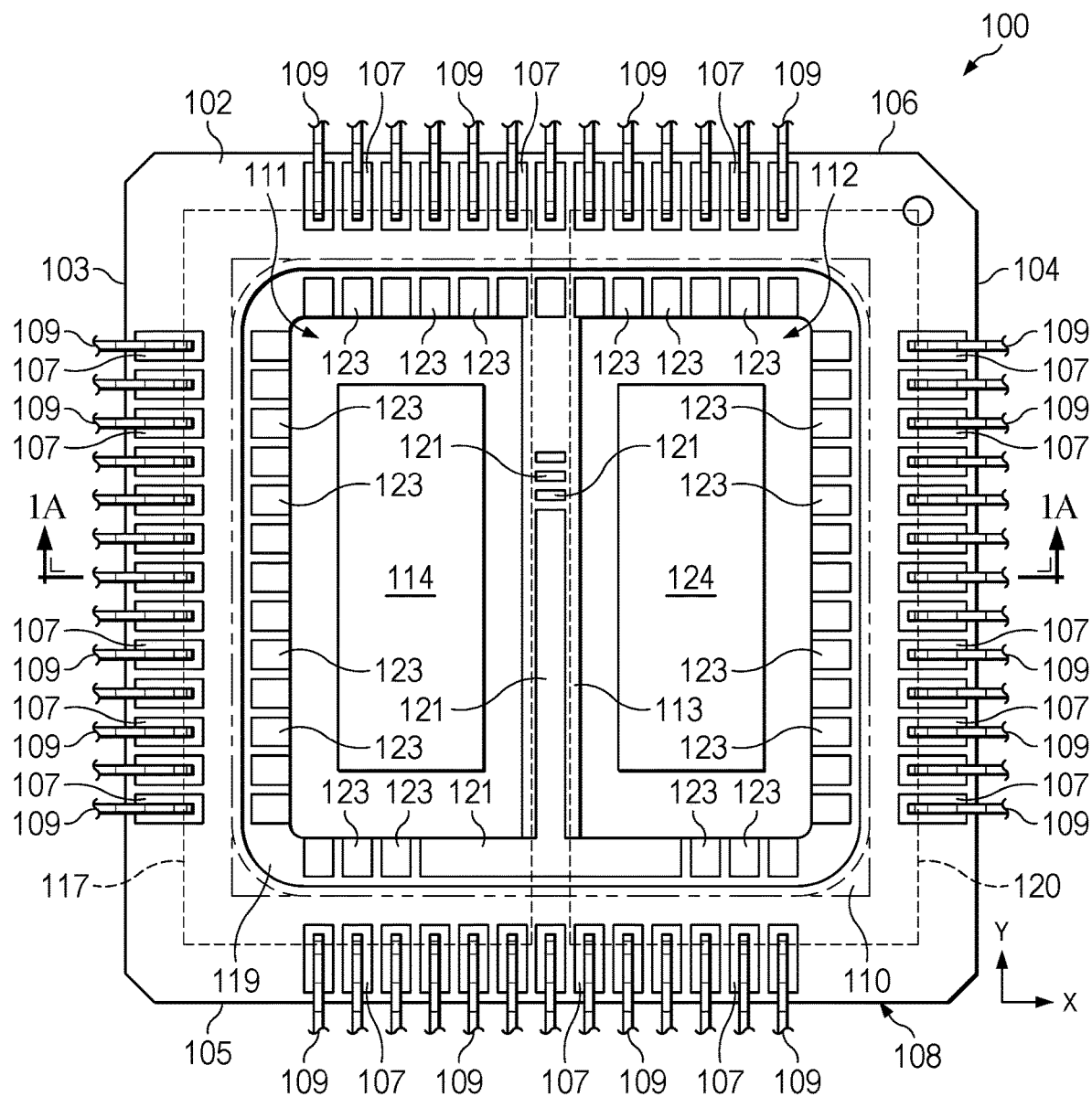
FIG. 1B is a top view of a multilevel ceramic body in the electronic device of FIGS. 1 and 1A.
Figure 1C:
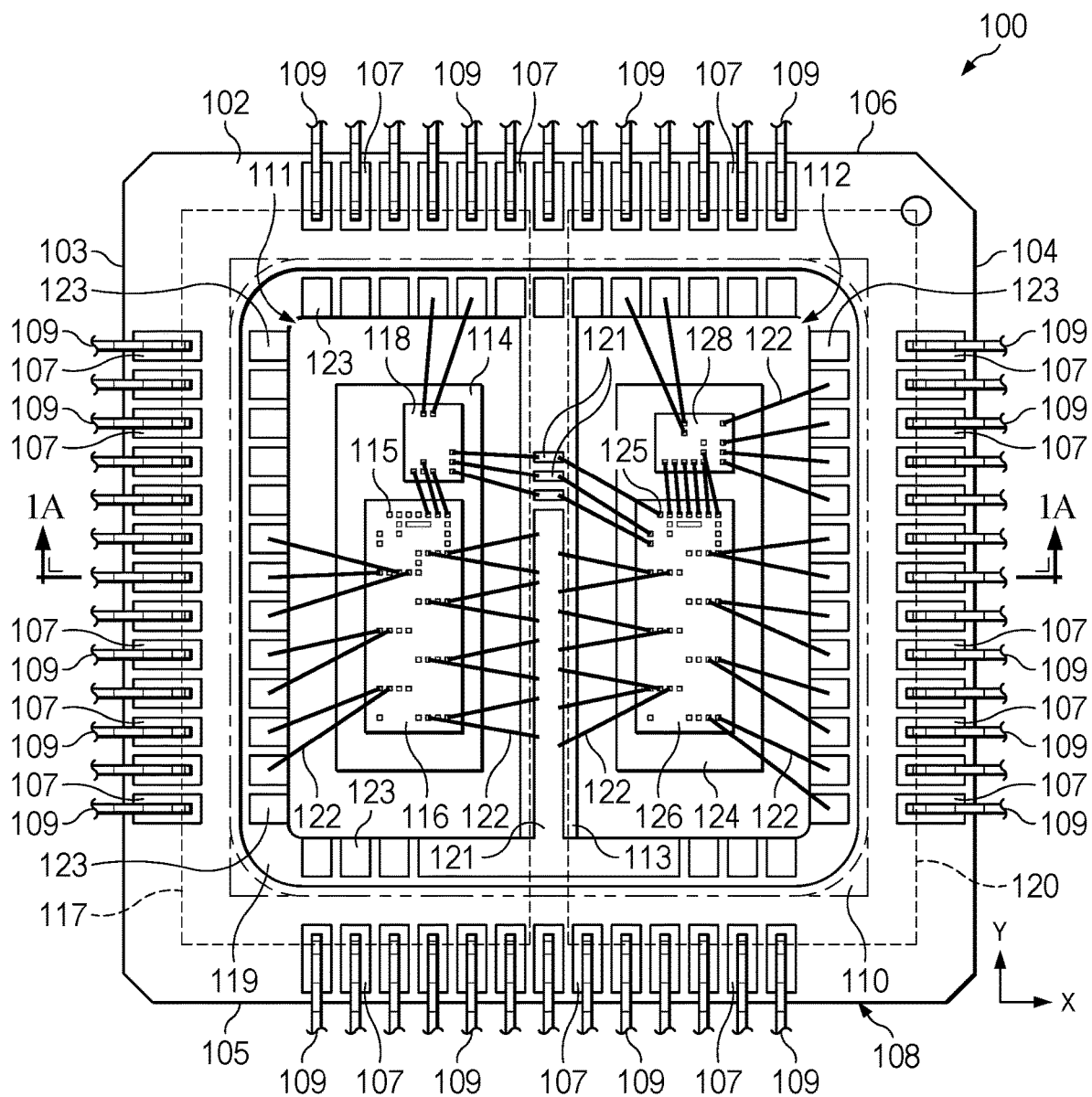
FIG. 1C is a partial top view of internal circuit connections in the electronic device of FIGS. 1-1B.
Figure 1D:
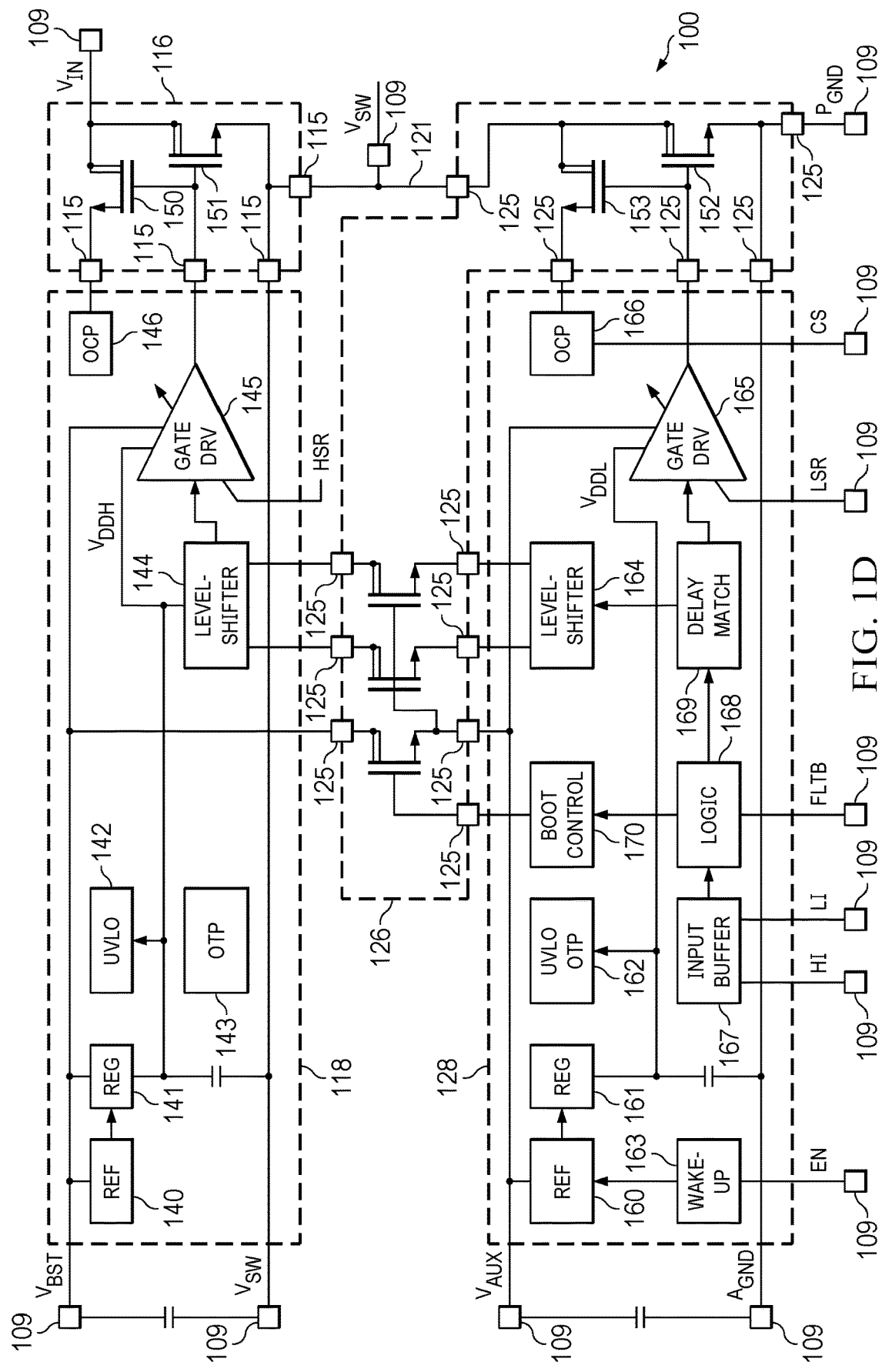
FIG. 1D is a schematic diagram of a half bridge circuit in the electronic device of FIGS. 1-1C.

FIGS. 1-1D show an example electronic device 100. FIG. 1 shows a top view of the electronic device 100, FIG. 1A shows a partial sectional side elevation view taken along line 1A-1A in FIG. 1, FIG. 1B shows a top view of the multilevel ceramic body 108, FIG. 1C shows a partial top view of internal circuit connections, and FIG. 1D shows a schematic diagram of a half bridge circuit in the electronic device 100. The electronic device 100 is shown in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another.

As best shown in FIG. 1A, the multilevel ceramic body 108 has opposite first and second (e.g., bottom and top) sides 101 and 102, respectively, which are spaced apart from one another along the third direction Z. As seen in FIGS. 1, 1B, and 1C, the multilevel ceramic body 108 and the electronic device 100 have laterally opposite third and fourth sides 103 and 104 spaced apart from one another along the first direction X, and opposite fifth and sixth sides 105 and 106 spaced apart from one another along the second direction Y in the illustrated orientation. The sides 101-106 in one example have substantially planar outer surfaces. In other examples, one or more of the sides 101-106 have curves, angled features, or other non-planar surface features.

The example multilevel ceramic body 108 has seven thin layer or levels stacked from the bottom first side 101 upwards along the third direction Z, and four thicker upper layers or levels. Each level includes printed low thermal resistance ceramic material such as alumina (e.g., $Al_2O_3$) high temperature co-fired ceramic (HTCC) or low temperature co-fired ceramic (LTCC or glass ceramic), beryllium oxide (e.g., BeO), aluminum nitride (e.g., AlN), silicon nitride (e.g., $Si_3N_4$), as well as patterned conductive metal to form traces and vias for signal routing and electrical interconnection of circuitry of the electronic device 100. The individual ceramic material levels have a high dielectric constant with high insulation resistance. In one example, the conductive metal features of the individual levels are or include plated electrolytic nickel, gold, silver, or other suitable conductive material formed by plating or printing, and the conductive features facilitate metal component brazing for good hermeticity for seal rings, heat sinks, radio frequency connectors, etc. (not shown). Moreover, the conductive features can include alloys with coefficient of thermal expansion (CTE) closely matched to the ceramic material.

The top level of the multilevel ceramic body 108 includes conductive pads 107 along the periphery of the four lateral sides 103-106 and exposed along the second side 102. The electronic device 100 has conductive leads 109, for example, including copper, aluminum, or other conductive metal as shown in FIGS. 1 and 1A. The individual leads 109 are connected to respective ones of the conductive pads 107 on the second side 102 of the multilevel ceramic body 108. The multilevel ceramic body 108 has first and second bottom side openings in the first side 101 and a third opening in the top or second side 102. The ceramic body levels are joined to form a sealed structure suitable for space applications or other harsh environments. The ceramic body 108 provides a mechanically robust housing that is sealed by three plates including a third plate 110 (FIGS. 1 and 1A) that is attached to the second side 102 by brazing or other suitable attachment technique to seal the third opening of the second side 102.

As shown in FIGS. 1-1C, the multilevel ceramic body 108 has respective first and second interior regions 111 and 112 that are defined by a ceramic separator structure 113 that extends between the first and second bottom side openings. A portion of the first interior region 111 extends above the first opening and a portion of the second interior region 112 extends above the second opening. The electronic device 100 includes a first die attach pad 114 (e.g., metal) that supports a first semiconductor die 116 in the first interior region 111 between the respective first and third plates 117 and 110. The first semiconductor die 116 has conductive features 115 (FIGS. 1A and 1C), such as metal bond pads for wire bond connection to form one or more circuits of the electronic device 100. As shown in FIGS. 1A-1C, a first plate 117 is attached to the first side 101 (e.g., by brazing or other suitable attachment technique) to cover and seal the first opening. In the illustrated example, the first die attach pad 114 is attached to a top side of the first plate 117 (e.g., by soldering or adhesive) and the first semiconductor die 116 is attached (e.g., by soldering or adhesive) to the top side of first die attach pad 114. In another implementation, the first die attach pad 114 is omitted and the first semiconductor die 116 is attached (e.g., by soldering or adhesive) to the top side of the first plate 117.

As best shown in FIGS. 1A-1C, the ceramic separator structure 113 includes a top side that faces the third plate 110. As further shown in FIGS. 1, 1C and the schematic diagram of FIG. 1D, another semiconductor die 118 is attached to the first die attach pad 114 and includes high side switching control circuitry (FIG. 1D) to operate a transistor of the first semiconductor die 116 as a high side switch in the half-bridge circuit of the electronic device 100. As shown in FIGS. 1A-1C, the top two ceramic levels of the multilevel ceramic body 108 are narrower than the remaining levels to provide a ledge 119 that faces the third opening and is spaced apart from the second side 102 of the multilevel ceramic body 108. The ledge 119 extends around the four lateral sides of the interior of the multilevel ceramic body 108 to facilitate bond wire interconnection of circuit components of the electronic device 100 as described further below.

A second plate 120 is attached to the first side 101 (e.g., by brazing or other suitable attachment technique) to cover and seal the second opening of the multilevel ceramic body 108. The ceramic separator structure 113 includes an upper or top side that faces the third plate 110 and a first conductive pad 121 on the side of the ceramic separator structure 113. In the illustrated example, the first conductive pad 121 is a switching node of a half-bridge circuit of the electronic device 100. The electronic device 100 includes electrical connections, some of which are provided by conductive trace and via routing features of the various levels of the multilevel ceramic body 108. Further electrical connections are provided by bond wires 122 (FIGS. 1A and 1C). The bond wire connections in this example include connections between conductive features (e.g., bond pads) of the semiconductor dies 116 and 118 to interconnect a high side circuit of the electronic device 100. In addition, bond wires 122 form connections between the respective conductive features of the semiconductor dies 116 and 118 and the first conductive pad 121 as well as further conductive pads 123 on the ledge 119 of the multilevel ceramic body 108. The ceramic separator structure 113 in the illustrated example includes multiple conductive pads labeled 121 in FIGS. 1B and 1C, including the first conductive pad 121 having a T shape to provide adequate current carrying capability to operate as a switching node of a half bridge transistor circuit.

The electronic device 100 in the illustrated example includes low side switch circuitry of the half bridge transistor circuit in the second interior region 112. The electronic device 100 includes a second die attach pad 124 (e.g., metal) that supports a second semiconductor die 126 in the second interior region 112 between the respective second and third plates 120 and 110. The second semiconductor die 126 has conductive features 125 (FIGS. 1A and 1C), such as metal bond. As shown in FIGS. 1A-1C, the second plate 120 is attached to the first side 101 (e.g., by brazing or other suitable attachment technique) to cover and seal the second opening. The second die attach pad 124 is attached to a top side of the second plate 120 (e.g., by soldering or adhesive) and the second semiconductor die 126 is attached (e.g., by soldering or adhesive) to the top side of second die attach pad 124. In another implementation, the second die attach pad 124 is omitted and the second semiconductor die 126 is attached (e.g., by soldering or adhesive) to the top side of the second plate 120.

As best shown in FIGS. 1A and 1C, the electronic device 100 includes a first bond wire 122 that electrically connects a first conductive feature 115 of the first semiconductor die 116 to the first conductive pad 121, for example, to connect a high side transistor source to the switching node of the half bridge circuit. In addition, the electronic device 100 includes a second bond wire 122 that electrically connects a first conductive feature 125 of the second semiconductor die 126 to the first conductive pad 121, for example, to connect a low side transistor drain to the switching node. The ceramic body 108 includes second and third conductive pads labeled 123 on the ledge 119 as best shown in FIG. 1A. The second conductive pad 123 is located on the ledge 119 in the first interior portion 111, and the third conductive pad 123 is located on the ledge 119 in the second interior portion 112 of the multilevel ceramic body 108. In this example, a second bond wire 122 electrically connects a second conductive feature 115 of the first semiconductor die 116 to the second conductive pad 123, for example, to connect a high side transistor drain to an input voltage node of the half bridge circuit. In addition, the electronic device 100 includes a third bond wire 122 that electrically connects a second conductive feature 125 of the second semiconductor die 126 to the third conductive pad 123, for example, to connect a low side transistor source to a ground or reference node of the half bridge circuit. As further shown in FIGS. 1, 1C and 1D, another semiconductor die 128 is attached to the second die attach pad 124 and includes switching control circuitry to operate a transistor of the second semiconductor die 126 as a low side switch in the half-bridge circuit of the electronic device 100.

FIG. 1D shows a schematic diagram of the half bridge circuit of the electronic device 100, which includes various electrical connections to respective ones of the conductive leads 109 to allow connection to a host circuit (not shown). One of the leads 109 is provided to deliver an input voltage signal $V_{IN}$ to the first semiconductor die 116 (e.g., with suitable ceramic body conductive routing interconnections to the second conductive pad 123 for connecting the high side transistor drain to the input voltage signal $V_{IN}$. One or more further conductive leads 109 provide a switching node voltage signal $V_{SW}$ from the first conductive features 115 and 125 of the respective first and second semiconductor dies 116 and 126 and the first conductive pad 121 to the host circuit. Further conductive leads 109 connect a ground or reference voltage signal $P_{GND}$, $A_{GND}$ to the low side transistor source, for example, by electrical connection to the second conductive feature 125 of the second semiconductor die 126. Additional ones of the conductive leads 109 provide interconnection of high and low side power supply voltage signals $V_{BST}$ and $V_{AUX}$ to the respective switching control semiconductor dies 118 and 128, as well as connection of control signals including a high side reset signal HSR, a low side reset signal LSR, an enable signal EN, high and low input buffer signals HI and LI, a boot control filter signal FLTB, and a current sense signal CS to the electronic device 100.

As further shown in FIG. 1D, the high side switching control semiconductor die 118 includes a reference circuit 140 that provides a control input to a regulator circuit 141 to control a regulation point of a high side supply voltage signal $V_{DDH}$. An undervoltage lockout (UVLO) circuit 142 monitors the high side supply voltage signal $V_{DDH}$ and an over temperature protection circuit 143 monitors the temperature of the circuitry. The high side switching control semiconductor die 118 also includes a level shifter circuit 144 that provides a signal to a high side gate driver circuit 145. The gate driver circuit 145 provides a gate switching control signal to operate the high side switch transistor of the first semiconductor die 116. The high side switching control semiconductor die 118 also includes an overcurrent protection (OCP) circuit 146 that senses a high side current of the first semiconductor die 116.

The first semiconductor die 116 includes a first transistor 151 that operates as a high side switch in the half bridge circuit of the electronic device 100. The first transistor 151 has a first source and a first drain, where the first source is coupled to the first conductive feature 115 of the first semiconductor die 116, and the first drain is coupled to the second conductive feature 115 of the first semiconductor die 116. The first semiconductor die 116 also includes a high side overcurrent protection sense transistor 150 connected to the drain of the high side first transistor 151 at the input voltage node, as well as to the over current protection circuit 146 of the high side switching control semiconductor die 118.

In the example of FIG. 1D, the second semiconductor die 126 includes a second transistor 152 that operates as a low side switch in the half bridge circuit of the electronic device 100. The second semiconductor die 126 includes a second transistor 152 having a second source and a second drain. The second drain is coupled to the first conductive feature 125 of the second semiconductor die 126, and the second source is coupled to the second conductive feature 125 of the second semiconductor die 126 for connection to the ground or reference voltage signal $P_{GND}$, $A_{GND}$. The second semiconductor die 126 also includes a low side overcurrent protection sense transistor 153 that is coupled to the drain of the second transistor 152. The transistors 152 and 153 have drain terminals connected to the first conductive feature 125 of the second semiconductor die 126 that are interconnected to the switching node at the first conductive pad 121 of the ceramic separator structure 113. As shown in FIG. 1D, the second semiconductor die 126 further includes level shift transistors coupled between level shift circuitry of the respective high and low side switching control semiconductor dies 118 and 128.

The low side switching control semiconductor die 128 in the example of FIG. 1D includes a reference circuit 160 that provides a control input to a regulator circuit 161 to control a regulation point of a low side supply voltage signal $V_{DDL}$. An undervoltage lockout (UVLO) and over temperature protection circuit 162 monitors the circuit temperature and the low side supply voltage signal $V_{DDL}$. A wake-up circuit 163 selectively enables the reference generator circuit 160 according to the enable signal EN from the host circuit (not shown). The low side switching control semiconductor die 128 also includes a level shifter circuit 164 that provides a signal to a low side gate driver circuit 165. The gate driver circuit 165 provides a gate switching control signal to operate the low side switch transistor of the second semiconductor die 126. The low side switching control semiconductor die 128 also includes an overcurrent protection (OCP) circuit 166 that provides the current sense signal CS to the host circuit and senses a low side current of the second semiconductor die 126 using the low side overcurrent protection sense transistor 153. The low side switching control semiconductor die 128 in this example further includes an input buffer 167 provides a signal to a logic circuit 168, and the logic circuit 168 provides control signals to a delay match circuit 169 that is coupled to the gate driver circuit 165. The delay match circuit 169 provides a control signal to the low side level shifter circuit 164, and the logic circuit 168 provides a control signal to a boot control circuit 170 that controls activation of the level shift connection transistors of the second semiconductor die 126.

Figure 2:
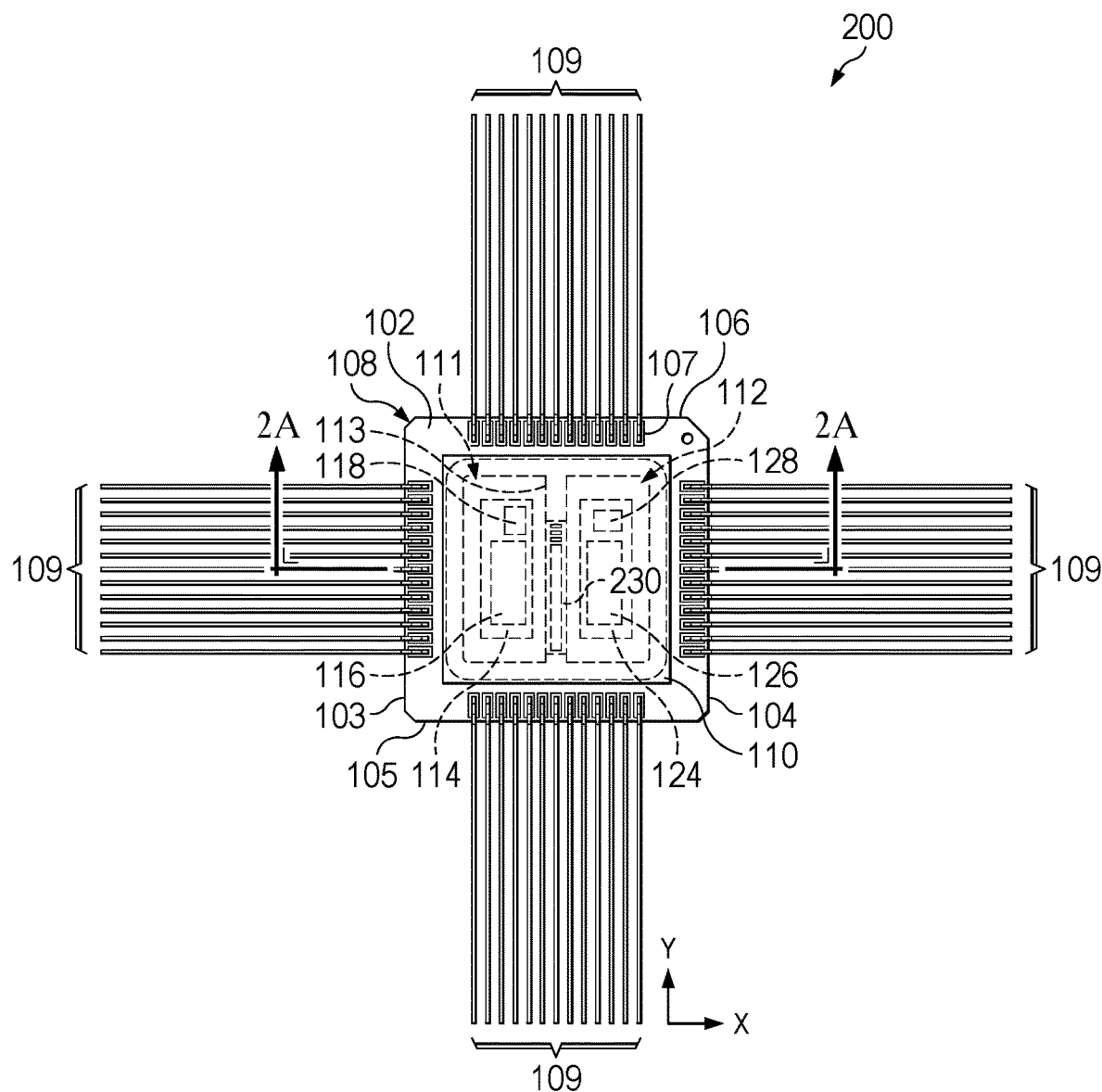
FIG. 2 is a top plan view of another electronic device with a multilevel ceramic structure having two bottom side openings and a separator structure and a substrate on the separator structure.
Figure 2A:
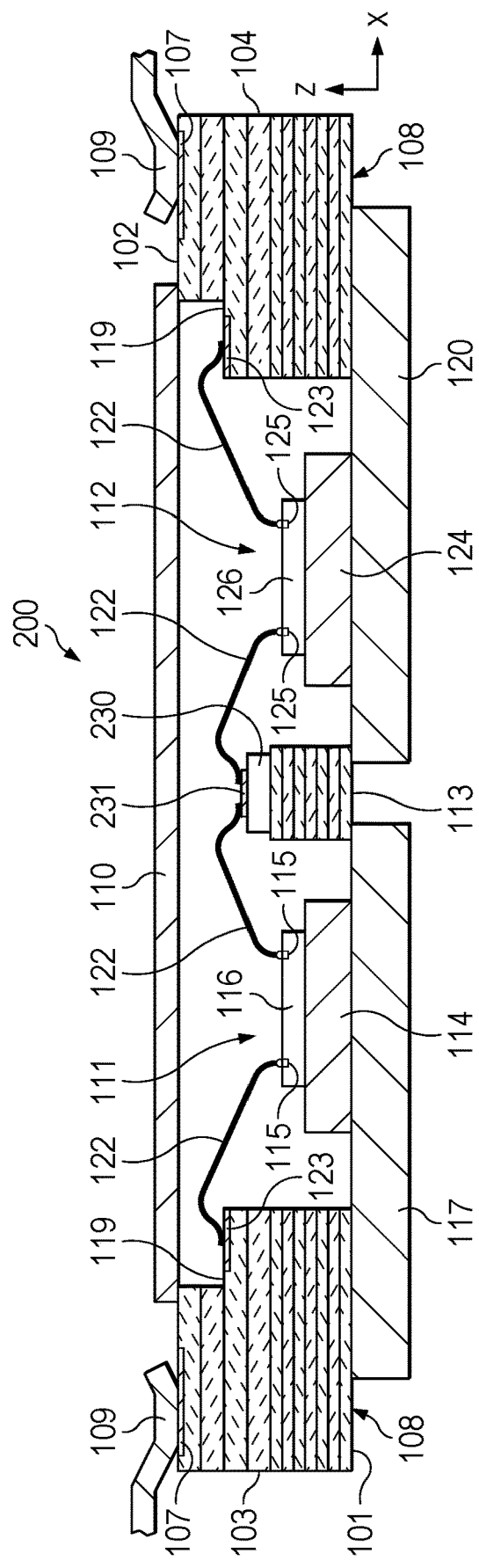
FIG. 2A is a partial sectional side elevation view of the electronic device taken along line 2A-2A in FIG. 2.
Figure 2B:
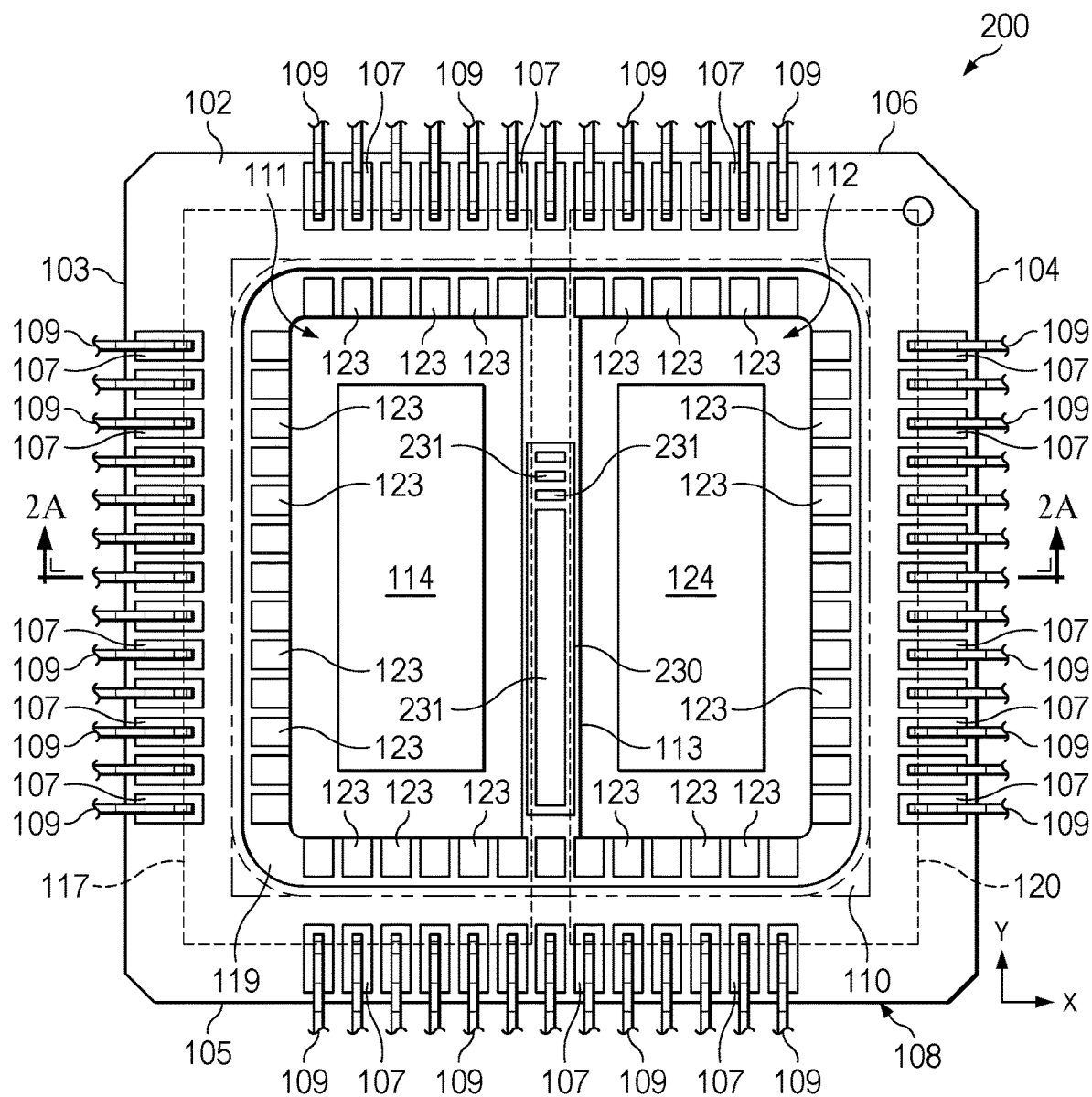
FIG. 2B is a top view of a multilevel ceramic body in the electronic device of FIGS. 2 and 2A.
Figure 2C:
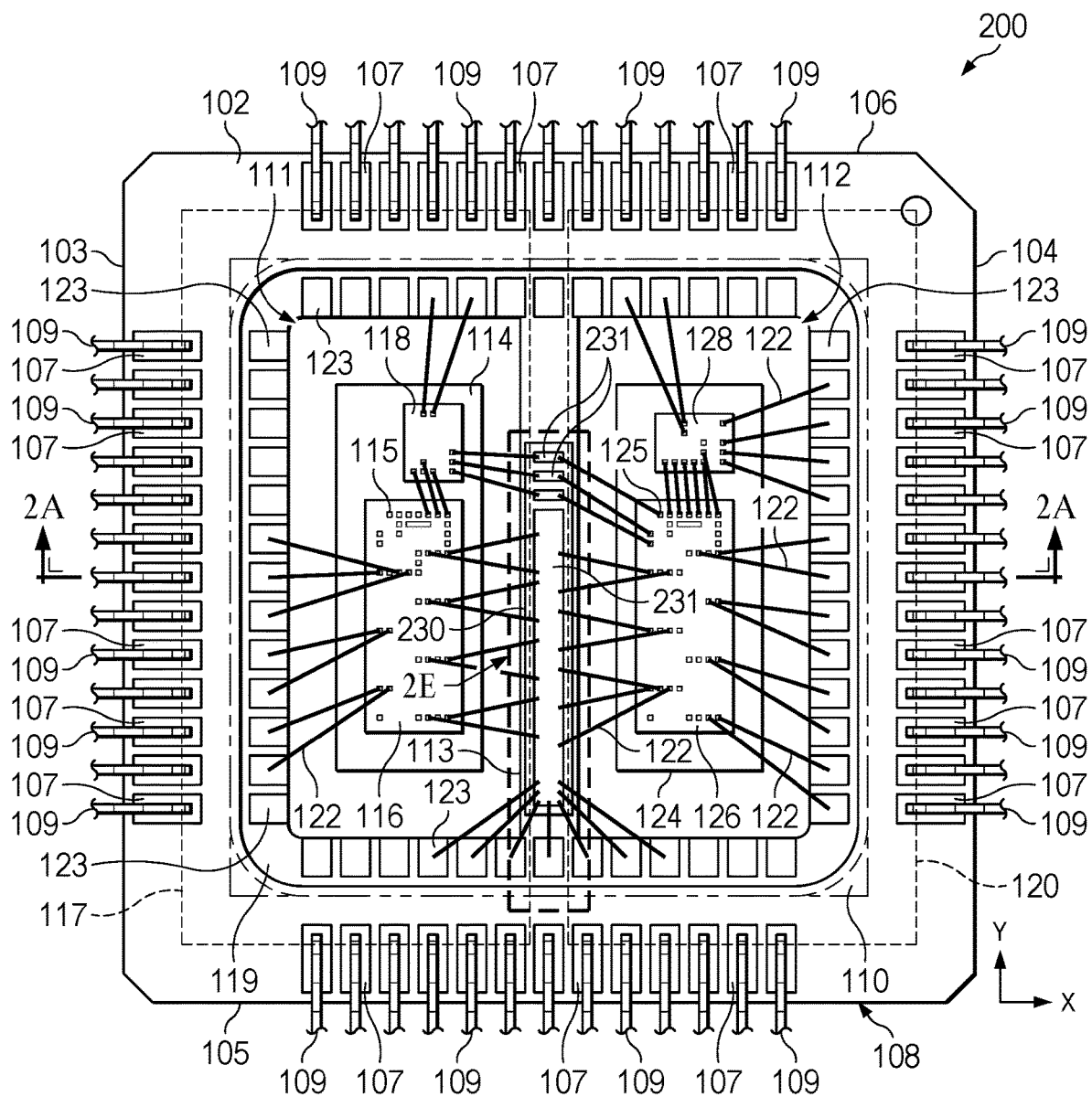
FIG. 2C is a partial top view of internal circuit connections in the electronic device of FIGS. 2-2B.
Figure 2D:
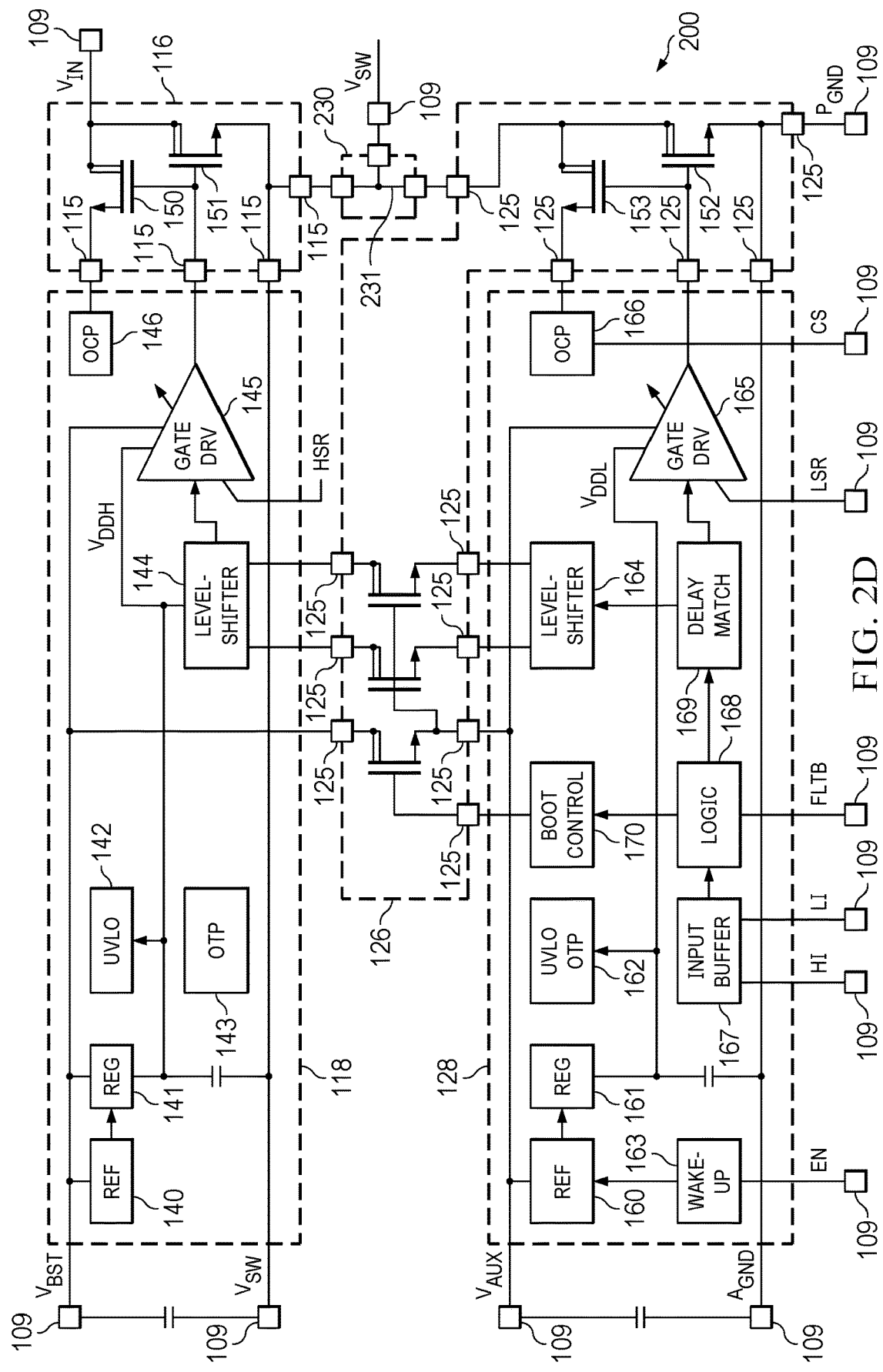
FIG. 2D is a schematic diagram of a half bridge circuit in the electronic device of FIGS. 2-2C.
Figure 2E:
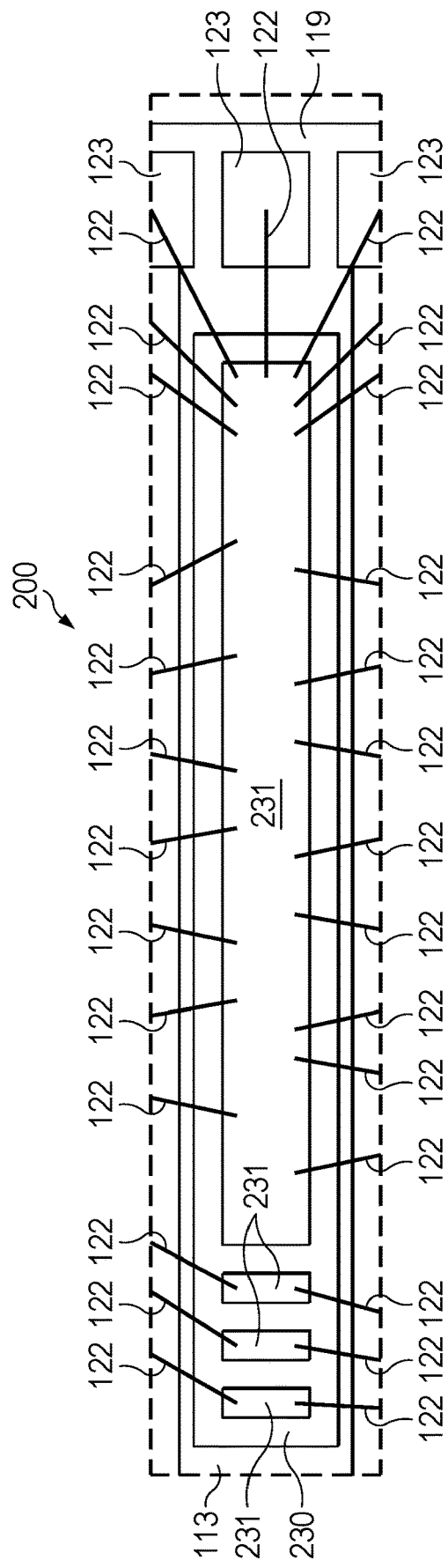
FIG. 2E is a partial top view of electrical connections to the substrate on the separator structure in the electronic device of FIGS. 2-2D.

FIGS. 2-2E illustrate another electronic device 200 with a multilevel ceramic structure 108 having two bottom side openings and the ceramic separator structure 113 as described above, as well as a substrate 230 on the separator structure 113. FIG. 2A shows a partial sectional side elevation view of the electronic device 200 taken along line 2A-2A in FIG. 2, FIG. 2B shows a top view of the multilevel ceramic body 108, FIG. 2C shows a partial top view of internal circuit connections in the electronic device 200, FIG. 2D shows a schematic diagram of a half bridge circuit in the electronic device 200, and FIG. 2E shows a partial top view of electrical connections to the substrate 230 on the separator structure 113 in the electronic device of FIGS. 2-2D. The electronic device 200 in FIGS. 2-2E includes similarly numbered structures and features 101-120, 122-126, 128, 140-146, 150-153, and 160-170 as shown in FIGS. 1-1D and described above. In this example, the electronic device 200 includes a substrate 230 on the ceramic separator structure 113, for example, by soldering or adhesive attachment of the substrate 230 onto the top side of the ceramic separator structure 113.

In this example, the substrate 230 includes a top side that faces the third plate 110 as well as a first conductive pad 231 on the top side of the substrate 230. The substrate 230 in one example is or includes an organic material which can have one or more layers or levels with patterned conductive trace features and possibly via features. In the illustrated implementation, the substrate 230 is a single layer FR4 or similar material with patterned conductive features that are or include copper, aluminum, etc., including the first conductive pad 231 that forms the switching node of the half bridge circuit of the electronic device 200. As shown in FIGS. 2, 2B, 2C and 2E, the example substrate 230 includes multiple conductive pads 231 on the top side thereof to facilitate electrical interconnection of the circuitry of the electronic device 200. In the illustrated half bridge circuit example, moreover, the use of the substrate 230 having patterned copper or aluminum conductive trace features on the top side facilitates enhanced current carrying capability for conducting switch node current in the half bridge circuit of the electronic device 200. As shown in FIG. 2A, the electronic device 200 includes the first bond wire 122 that electrically connects the first conductive feature 115 of the first semiconductor die 116 to the first conductive pad 231 of the substrate 230, and the second bond wire 122 electrically connects the first conductive feature 125 of the second semiconductor die 126 to the first conductive pad 231. This provides a low resistance connection between the source of the high side first transistor 151 of the first semiconductor die 116 (FIG. 2D), the switching node and its associated conductive lead 109, and the drain of the low side second transistor 152 of the second semiconductor die 128.

FIG. 2D illustrates a partial top view that shows further details of the substrate 230 attached to the top side of the ceramic separator structure 113. This example includes multiple bond wires 122 connected to the switching node at the large first conductive pad 231, for example, to support high switch node current flow in operation of the half bridge circuit of the electronic device 200. Additional conductive traces 231 are provided in this example for interconnecting circuitry of the respective first and second switching control semiconductor dies 118 and 128 (e.g., see also FIG. 2C). In other implementations, the enhanced conductivity of the conductive pads 231 of the organic substrate 230 can be employed with further conductive pads 231 on the illustrated substrate 234 other circuit interconnections in the electronic device 200. In these or another implementation, additional organic substrates can be included in the interior of the electronic device 234 similar purposes.

Figure 3:
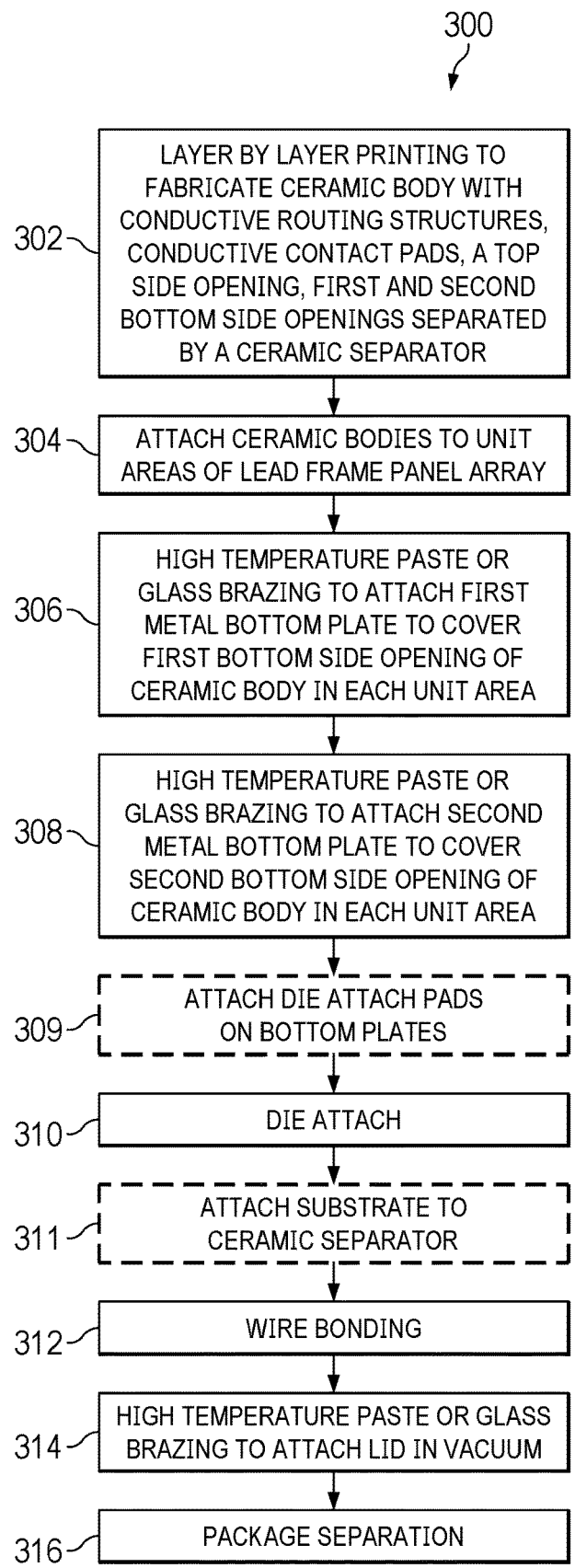
FIG. 3 is a flow diagram of a method of fabricating an electronic device with a multilevel ceramic structure having two bottom side openings and a separator structure.
Figure 4:
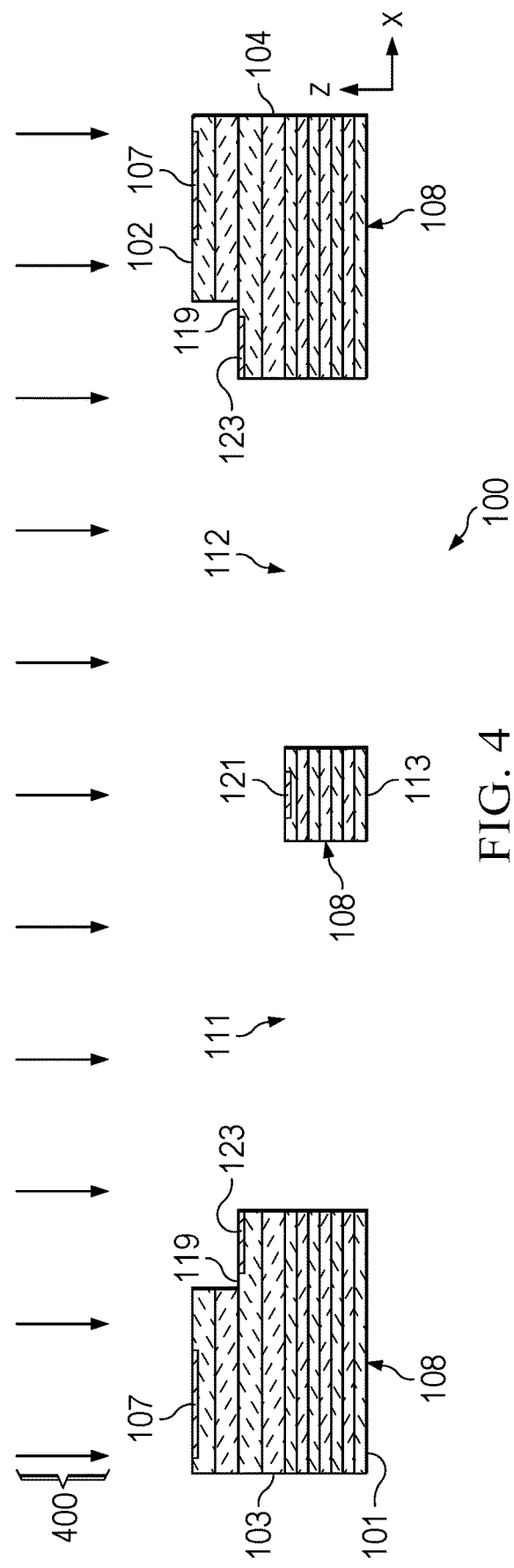
FIGS. 4-13 are sectional side elevation and top views of the electronic devices of FIGS. 1 and 2 undergoing fabrication processing according to the method of FIG. 3.

Referring also to FIGS. 3-13, FIG. 3 shows a method 300 for fabricating an electronic device with a multilevel ceramic structure having two bottom side openings and a ceramic separator structure, and FIGS. 4-13 illustrate fabrication of the example electronic devices 100, 200 according to the method 300 of FIG. 3. The method 300 begins at 302 and FIG. 3 with construction of the multilevel ceramic structure 108. FIG. 4 shows one example of the processing at 302, in which a layer by layer or level by level fabrication process 400 is performed to construct the multilevel ceramic structure 108. The process 400 sequentially creates the ceramic levels and associated conductive trace and via features of each level using suitable ceramic and conductive metal materials. In one example, the process 400 includes printing low thermal resistance ceramic material for each individual level, such as alumina (e.g., $Al_2O_3$) high temperature co-fired ceramic (HTCC) or low temperature co-fired ceramic (LTCC or glass ceramic), beryllium oxide (e.g., BeO), aluminum nitride (e.g., AlN), silicon nitride (e.g., $Si_3N_4$), in combination with selective deposition, printing, plating, or other construction of patterned conductive metal to form traces and vias for signal routing and electrical interconnection of the above described conductive pads 107, 121, 123, and 231. The individual levels in one example are created using ceramic material having a high dielectric constant with high insulation resistance, and the conductive metal features of the individual levels are or include alloys with CTE matched to that of the ceramic material, including without limitation plated electrolytic nickel, gold, silver, or other suitable conductive material.

Figure 5:
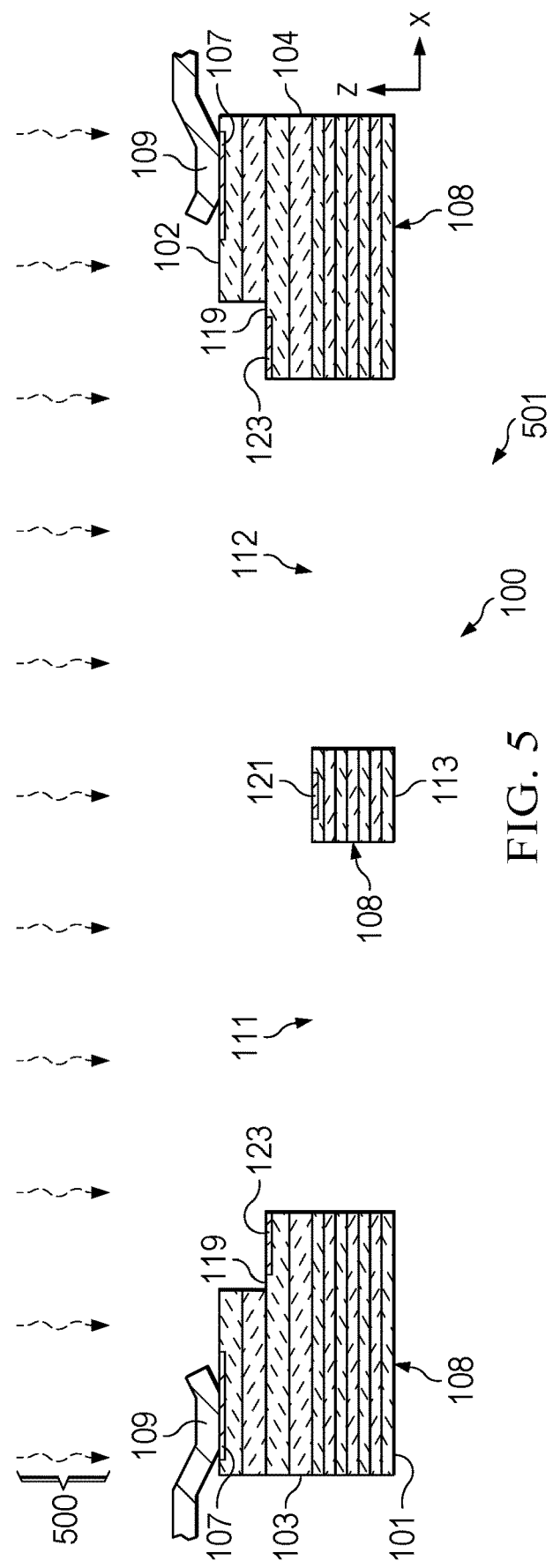
Figure 5A:
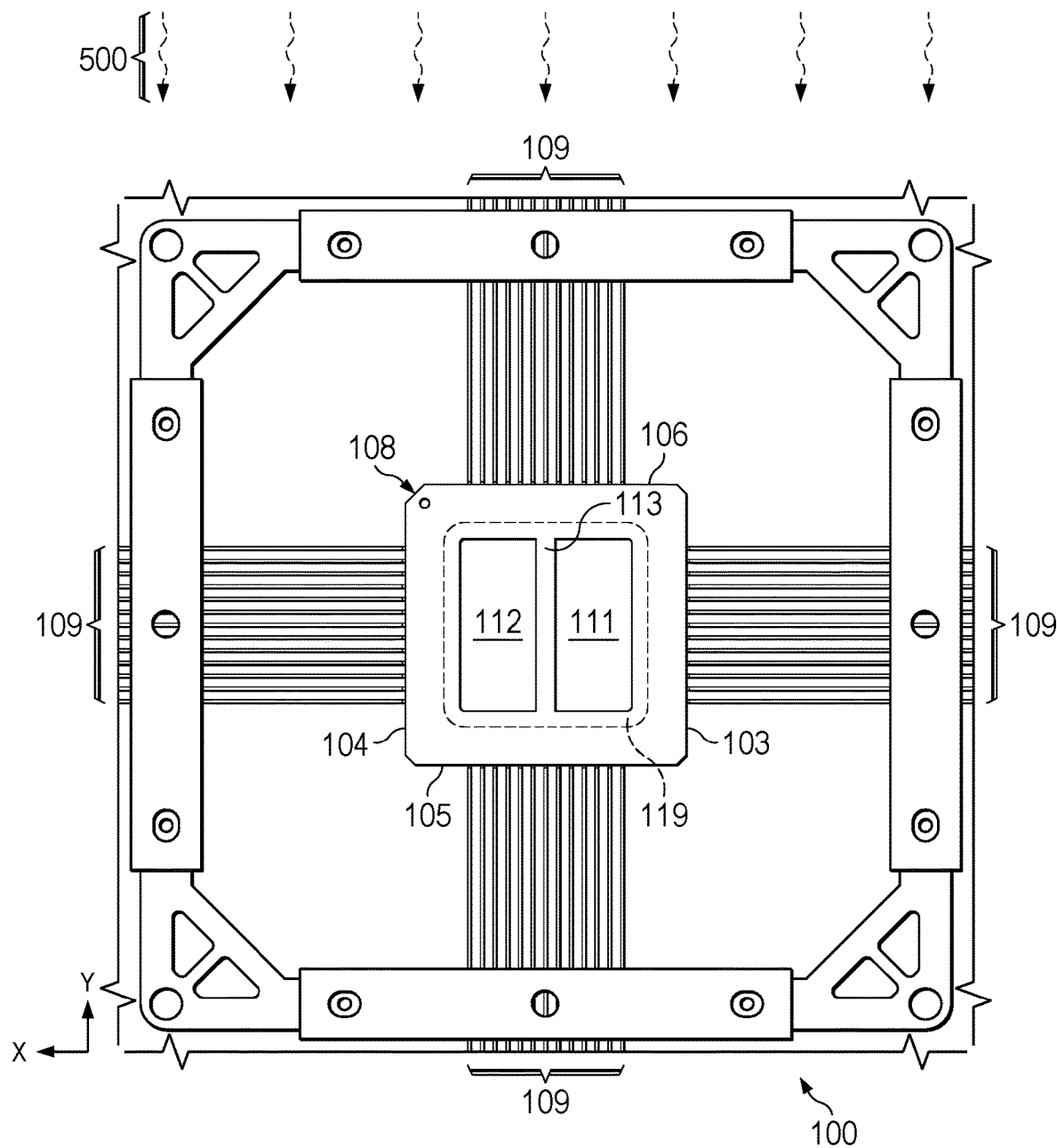

The method 300 continues at 304 in FIG. 3 with attaching the conductive leads 109 to respective conductive pads 107 on the second side 102 of the multilevel ceramic body 108. FIGS. 5 and 5A a show respective sectional side and top views of one example, in which a brazing process 500 is performed that attaches the conductive leads 109 to the top or second side 102 of the multilevel ceramic body 108. In one implementation, the leads 109 are initially part of a lead frame panel array having rows and columns of unit areas, one of which is shown in FIG. 5A. In this example, multilevel ceramic bodies 108 are constructed at 302 for each of the unit areas of the lead frame panel array, and the conductive pads 107 of each individual multilevel ceramic body 108 are brazed to the respective leads 109 of the corresponding unit area of the lead frame panel array at 304. In one implementation, automated pick and place equipment (not shown) positions a multilevel ceramic body 108 in a given unit area of the lead frame panel array and brazing equipment (not shown) attaches conductive leads 109 to respective conductive pads 107 on the second side 102 of the multilevel ceramic body 108, and the process 500 is then repeated for the remaining unit areas of the lead frame panel array.

Figure 6:
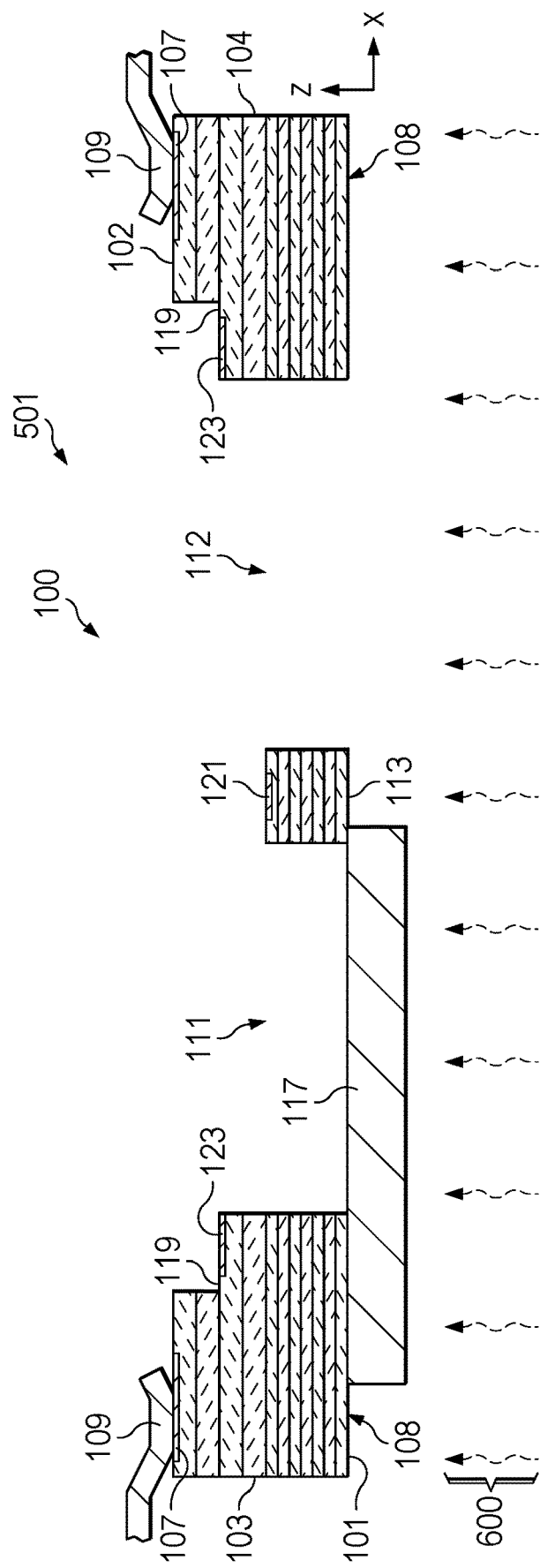

The method 300 continues at 306 in FIG. 3 with attaching the first metal bottom plate 117 to cover the first bottom side opening of the multilevel ceramic body 108 in each of the unit areas of the lead frame panel array. FIG. 6 shows one example of the processing at 306, in which a brazing process 600 is performed that attaches the first plate 117 to cover and seal the first opening in the first side 101 of the multilevel ceramic body 108 for the illustrated unit area, and similar processing is performed for the other unit areas of the lead frame panel array.

Figure 7:
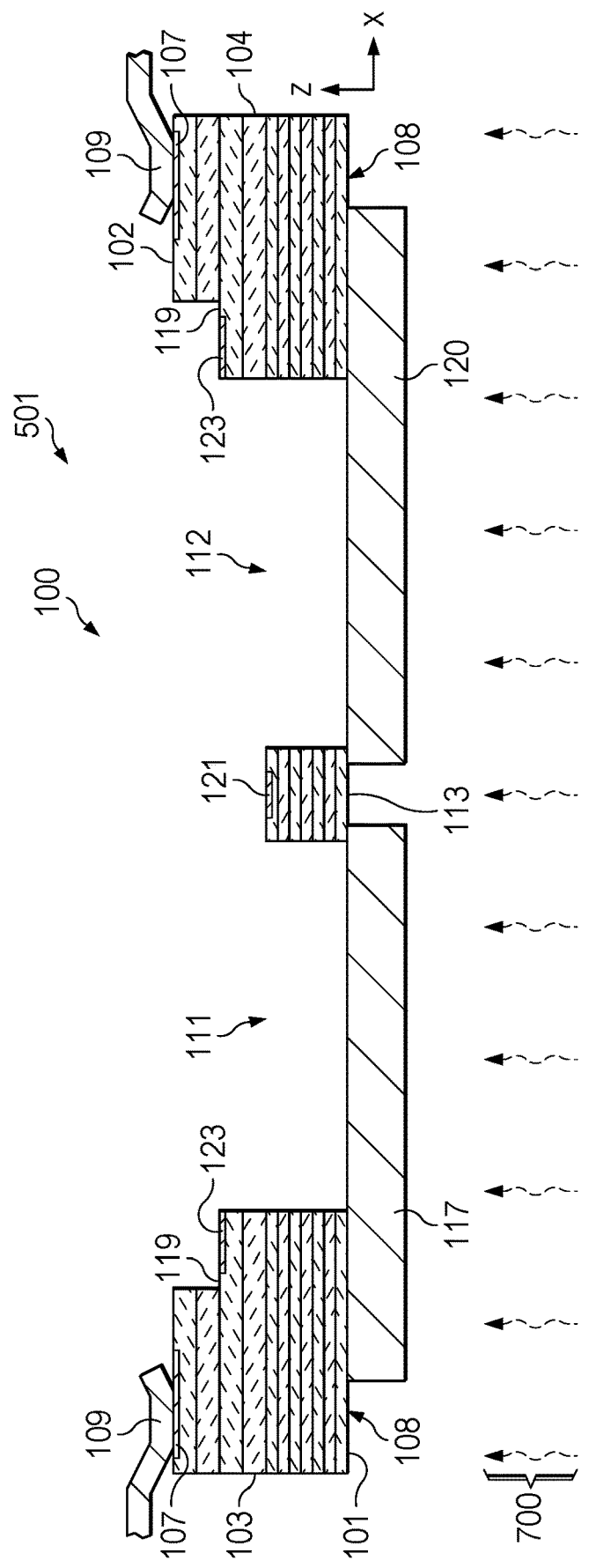

The method 300 continues at 308 in FIG. 3 with attaching the second metal bottom plate 120 to cover the second opening of the multilevel ceramic body 108 in each unit area. FIG. 7 shows one example of the processing at 308, in which a brazing process 700 is performed that attaches the second plate 120 to cover and seal the second opening in the first side 101 of the multilevel ceramic body 108 in the illustrated unit area. The processing at 308 includes performing a similar brazing process 700 to attach respective second plates in the other unit areas of the lead frame panel array.

Figure 8:
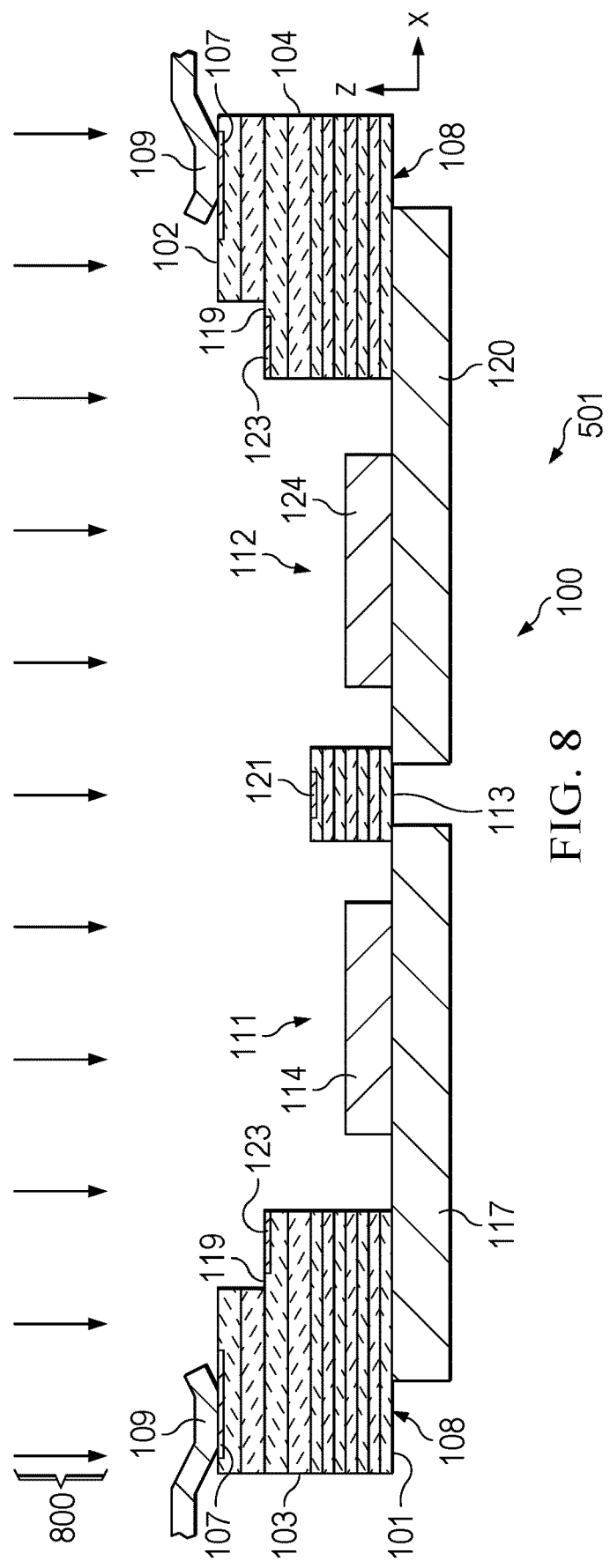

In one example, the method 300 includes mounting the die attach pads 114 and 124 at 309 in FIG. 3 on the respective plates 117 and 120 prior to die attach processing at 310. In another implementation, the die attach pads 114 and 124 and the associated attachment processing at 309 are omitted. FIG. 8 shows one example of the processing at 309, in which an attachment process 800 is performed that mounts the die attach pads 114 and 124 on to the top sides of the respective first and second plates 117 and 120, for example, by soldering or using an adhesive and optionally curing the adhesive to attach first die attach pad 114 on the first plate 117 in the first interior portion 111 of the ceramic body 108 and to attach the second die attach pad 124 on the second plate 120 in the second interior portion 112 of the ceramic body 108.

Figure 9:
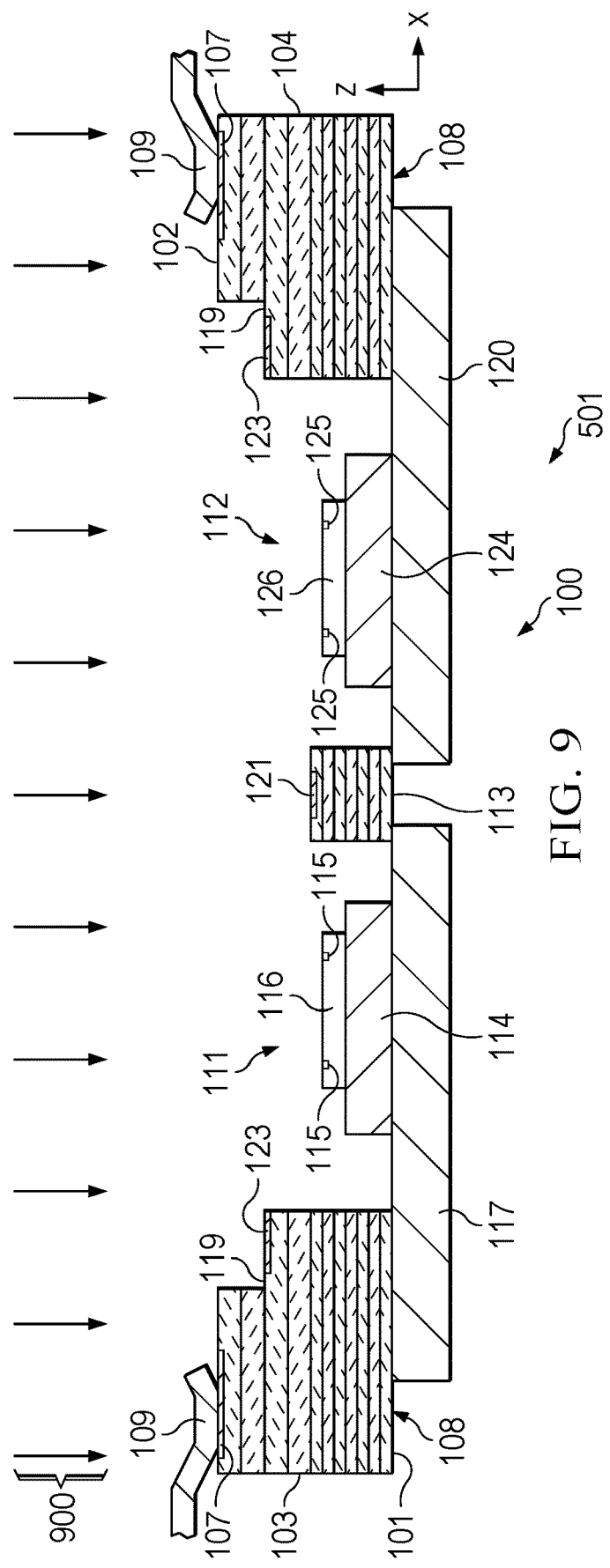

The method 300 also includes die attachment at 310 in FIG. 3. FIG. 9 shows one example of the processing at 310, in which a die attach process 900 is performed that attaches the first semiconductor die 116 in the first interior portion 111 of the ceramic body 108 above the first plate 117 and attaches the second semiconductor die 126 in the second interior portion 112 above the second plate 120. In the illustrated example, the dies 116 and 126 are attached to the top sides of the respective die attach pads 114 and 124. In another implementation, the die attach pads 114 and 124 are omitted, and the dies 116 and 126 are attached to the top sides of the respective first and second plates 117 and 120. Any suitable die attach processing 900 can be used, including attachment using an adhesive (e.g., with or without optional curing), flip chip die attach or other soldering, etc.

Figure 10:
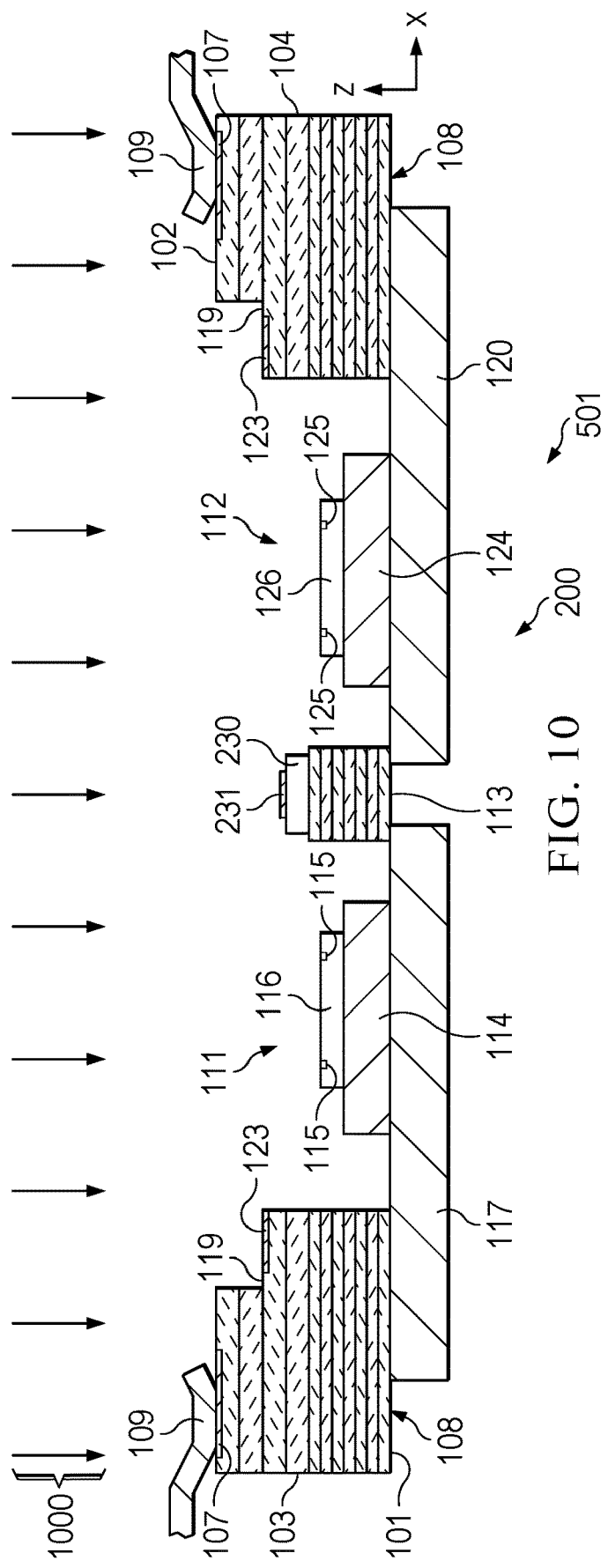

In one example (e.g., to fabricate the electronic device 200 illustrated and described above in connection with FIGS. 2-2E), the method 300 includes a substrate attachment at 311 in FIG. 3. FIG. 10 shows one example of the optional processing at 311, in which the substrate attachment process 1000 is performed that attaches the substrate 230 onto the top side of the ceramic separator structure 113. In one example, the substrate attachment process 1000 includes automated dispensing or printing of an adhesive on the top side of the ceramic separator structure 113 between the respective first and second interior portions 111 and 112, as well as pick and place attachment of the substrate 230 onto the adhesive in each unit area of the lead frame panel array, and optionally curing the adhesive.

Figure 11:
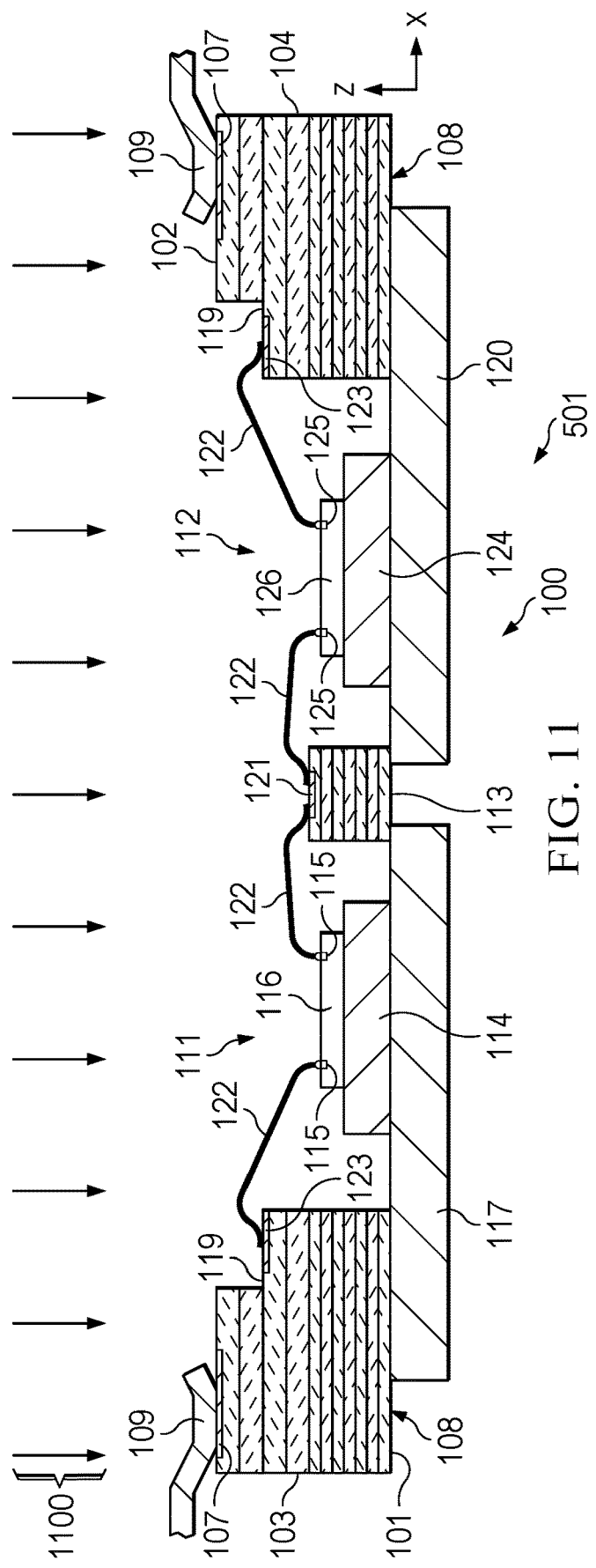

The method 300 continues at 312 in FIG. 3 with electrical connection. FIG. 11 shows one example of the connection processing at 312, in which a wire bonding process 1100 is performed that electrically connects conductive features of the semiconductor dies 116, 118, 126, and 128 and the conductive pads 121 and 123 (and 231 of any included substrate 230 in the device 200) to provide the suitable electrical interconnections for the finished electronic device 100, 200. The wire bonding process 1100 in the illustrated example forms the bond wires 122 as described above to form the electrical connections of the example half bridge circuits (e.g., FIGS. 1D and 2D above). In other implementations, different electrical interconnection processes can be used, such as flip chip soldering operations, etc., alone or in combination with wire bonding. In the illustrated example, the wire bonding process 1100 includes connecting the first bond wire 122 between the first conductive feature 115 of the first semiconductor die 116 and the first conductive pad 231 of the substrate 230, connecting the second bond wire 122 between the first conductive feature 125 of the second semiconductor die 126 and the first conductive pad 231 of the substrate 230, connecting the third bond wire 122 between the second conductive feature 115 of the first semiconductor die 116 and the second conductive pad 123 of the ceramic body 108, and connecting the fourth bond wire 122 between the second conductive feature 125 of the second semiconductor die 126 and the third conductive pad 123 of the ceramic body 108, as well as forming the further bond wires 122 illustrated above (e.g., FIGS. 1C, 2C, and 2E).

Figure 12:
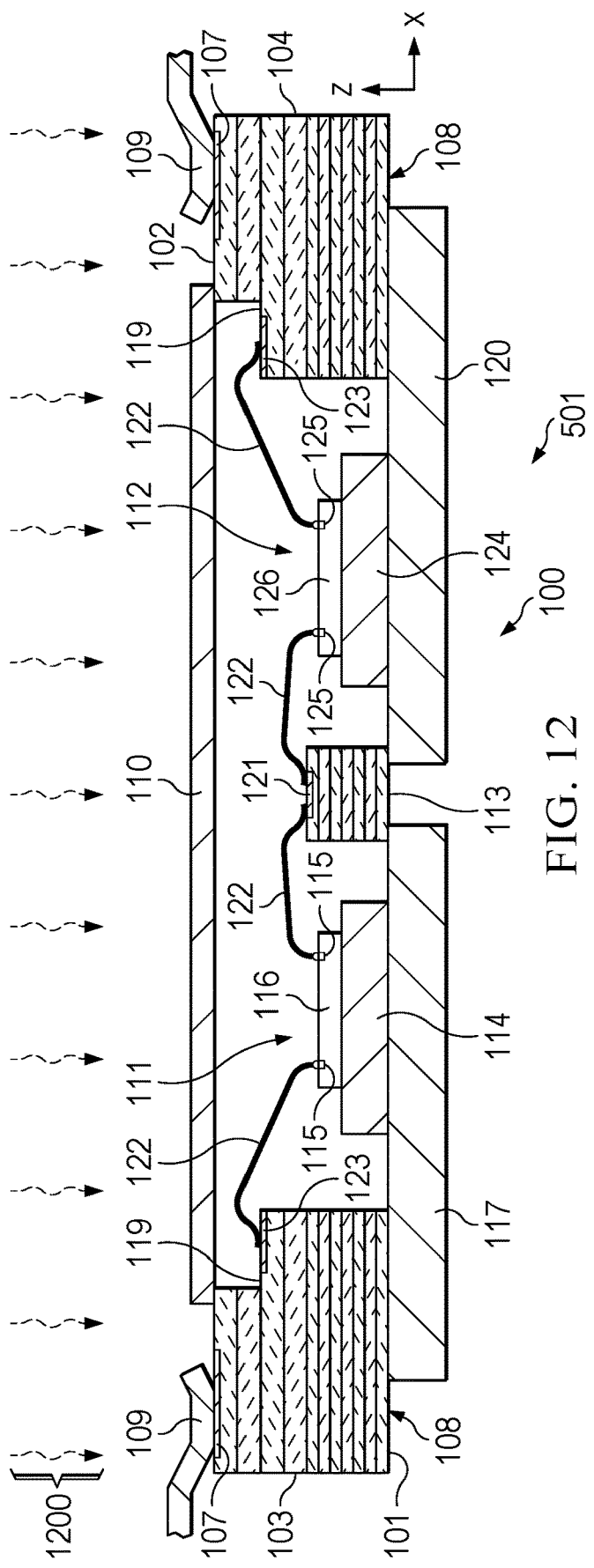

The method 300 continues at 314 in FIG. 3 with closure of the upper third opening of the multilevel ceramic body 108. FIG. 12 shows one example, in which a brazing process 1200 is performed that attaches the third plate 110 to cover the third opening in the second side 102 of the multilevel ceramic body 108. In one implementation, the brazing process 1200 is performed while the lead frame panel array is in a controlled vacuum environment so as to create a hermetically sealed interior of the electronic device 100, 200, for example, for space applications or devices intended for use in other harsh environmental conditions.

Figure 13:
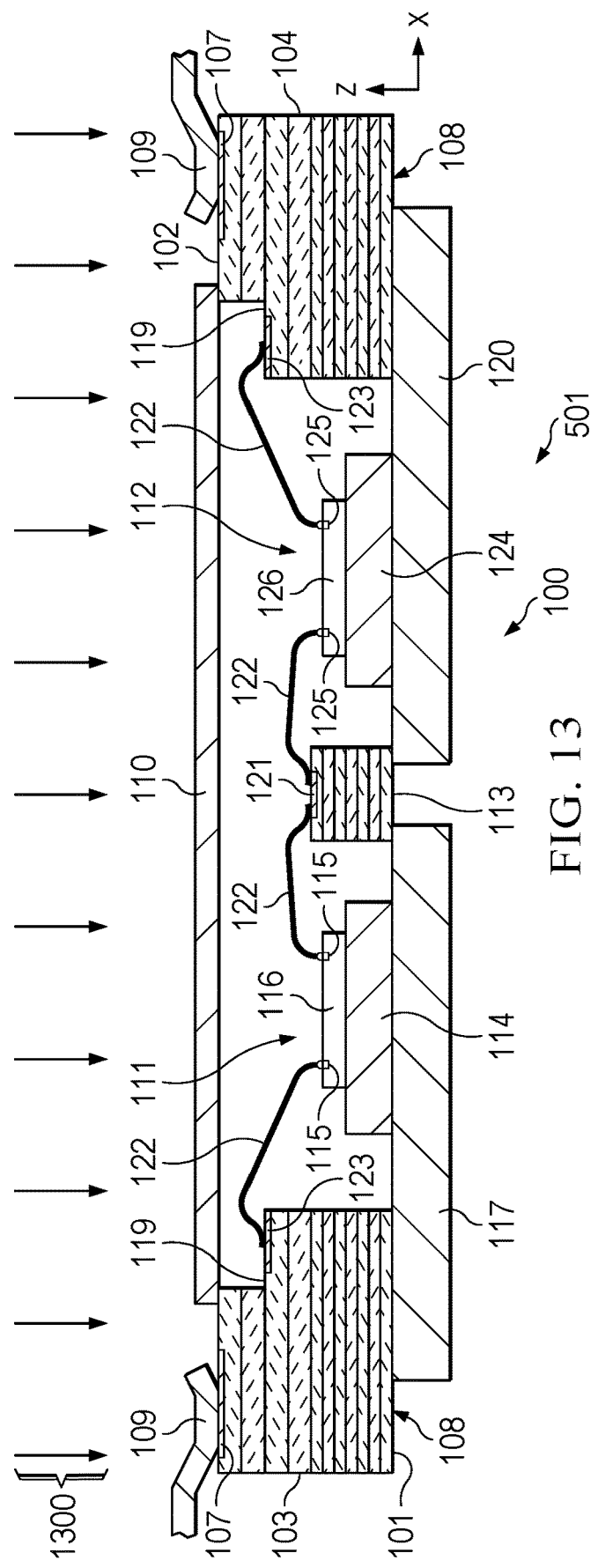

At 316 in FIG. 3, the method 300 includes package separation processing to separate individual packaged electronic devices 100, 200 from the starting lead frame panel array structure. FIG. 13 shows one example, in which a package separation process 1300 is performed that separates the illustrated electronic device 100 from the starting lead frame panel array. In one example, the package separation process 1300 includes a saw cutting, laser cutting, or other metal separation process that trims the leads 109 and separates the individual packaged electronic devices from the lead frame panel array. In this or another example, the package separation process 1300 also includes optional lead forming operations (not shown), for example, to bend or otherwise formed the leads 109 into a desired shape to accommodate installation and a host system.

The described examples provide electronic devices 100, 200, multilevel ceramic bodies 108, and fabrication methods 300 to facilitate electronic device packaging for space applications and other systems in which the high reliability advantages of ceramic packages are desirable, in combination with advantages in the ability to integrate more circuitry in compact electronic devices with the capability of hermetic sealing and good thermal management with options for heatsinks as well as high-frequency (e.g., RF) signal interconnections, etc. The described examples facilitate integration of complicated circuitry and a compact module, such as integrated power module devices with enhanced power ratings.

Modifications are possible in the described examples, and other implementations are possible, within the scope of the claims.

What is claimed is:
1. An electronic device, comprising:
   a multilevel ceramic body having opposite first and second sides, a first opening in the first side, a second opening in the first side, a third opening in the second side, and a ceramic separator structure between the first and second openings, the ceramic separator defining first and second interior portions of the ceramic body;
a first plate attached to the first side and covering the first opening;
a second plate attached to the first side and covering the second opening;
a third plate attached to the second side and covering the third opening;
a first semiconductor die in the first interior portion of the ceramic body between the first and third plates; and
a second semiconductor die in the second interior portion of the ceramic body between the second and third plates.

2. The electronic device of claim 1, wherein:
the ceramic separator structure includes: a side that faces the third plate; and a first conductive pad on the side of the ceramic separator structure; and
the electronic device further comprises:
    a first bond wire that electrically connects a conductive feature of the first semiconductor die to the first conductive pad; and
    a second bond wire that electrically connects a conductive feature of the second semiconductor die to the first conductive pad.

3. The electronic device of claim 2, wherein:
the ceramic body includes: a second conductive pad in the first interior portion; and a third conductive pad in the second interior portion; and
the electronic device further comprises:
    a third bond wire that electrically connects a second conductive feature of the first semiconductor die to the second conductive pad; and
    a fourth bond wire that electrically connects a second conductive feature of the second semiconductor die to the third conductive pad.

4. The electronic device of claim 3, further comprising leads coupled to respective further conductive pads on the second side of the ceramic body.

5. The electronic device of claim 3, wherein:
the first semiconductor die includes a first transistor having a first source and a first drain, the first source coupled to the conductive feature of the first semiconductor die, and the first drain coupled to the second conductive feature of the first semiconductor die;
the second semiconductor die includes a second transistor having a second source and a second drain, the second drain coupled to the conductive feature of the second semiconductor die, and the second source coupled to the second conductive feature of the second semiconductor die; and
the first conductive pad is a switching node of a half bridge circuit formed by the first and second transistors.

6. The electronic device of claim 2, wherein:
the first semiconductor die includes a first transistor having a first source and a first drain, the first source coupled to the conductive feature of the first semiconductor die, and the first drain coupled to the second conductive feature of the first semiconductor die;
the second semiconductor die includes a second transistor having a second source and a second drain, the second drain coupled to the conductive feature of the second semiconductor die, and the second source coupled to the second conductive feature of the second semiconductor die; and
the first conductive pad is a switching node of a half bridge circuit formed by the first and second transistors.

7. The electronic device of claim 1, further comprising:
a substrate on the ceramic separator structure, the substrate including: a side that faces the third plate; and a first conductive pad on the side of the substrate; and
the electronic device further comprises:
    a first bond wire that electrically connects a conductive feature of the first semiconductor die to the first conductive pad; and
    a second bond wire that electrically connects a conductive feature of the second semiconductor die to the first conductive pad.

8. The electronic device of claim 7, wherein:
the ceramic body includes: a second conductive pad in the first interior portion; and a third conductive pad in the second interior portion; and
the electronic device further comprises:
    a third bond wire that electrically connects a second conductive feature of the first semiconductor die to the second conductive pad; and
    a fourth bond wire that electrically connects a second conductive feature of the second semiconductor die to the third conductive pad.

9. The electronic device of claim 7, wherein:
the first semiconductor die includes a first transistor having a first source and a first drain, the first source coupled to the conductive feature of the first semiconductor die, and the first drain coupled to the second conductive feature of the first semiconductor die;
the second semiconductor die includes a second transistor having a second source and a second drain, the second drain coupled to the conductive feature of the second semiconductor die, and the second source coupled to the second conductive feature of the second semiconductor die; and
the first conductive pad is a switching node of a half bridge circuit formed by the first and second transistors.

10. The electronic device of claim 1, wherein:
the first semiconductor die includes a first transistor having a source coupled to a conductive pad on the ceramic separator structure;
the second semiconductor die includes a second transistor having a drain coupled to the conductive pad on the ceramic separator structure to form a switching node of a half bridge circuit formed by the first and second transistors.

11. The electronic device of claim 1, further comprising:
a first die attach pad on the first plate in the first interior portion of the ceramic body; and
a second die attach pad on the second plate in the second interior portion of the ceramic body;
wherein the first semiconductor die is on the first die attach pad, and the second semiconductor die is on the second die attach pad.

12. A multilevel ceramic body, comprising:
opposite first and second sides;
laterally opposite third and fourth sides spaced apart from one another along a first direction;
laterally opposite fifth and sixth sides spaced apart from one another along a second direction that is orthogonal to the first direction;
a first opening in the first side;
a second opening in the first side, the second opening spaced apart from the first opening along the first direction;

a third opening in the second side; and
a ceramic separator structure extending along the second direction between the fifth and sixth sides and between the first and second openings.

13. The multilevel ceramic body of claim 12, wherein:
the ceramic separator structure includes: a side that faces the third opening and is spaced apart from the second side of the ceramic separator structure; and a first conductive pad on the side of the ceramic separator structure; and
the multilevel ceramic body includes: a ledge that faces the third opening and is spaced apart from the second side of the multilevel ceramic body; a second conductive pad on the ledge in a first interior portion of the multilevel ceramic body; and a third conductive pad on the ledge in a second interior portion of the multilevel ceramic body.

14. The multilevel ceramic body of claim 13, comprising further conductive pads on the second side of the ceramic body.

15. A method of fabricating an electronic device, the method comprising:
attaching a first plate to cover a first opening in a first side of a multilevel ceramic body;
attaching a second plate to cover a second opening in the first side of the multilevel ceramic body;
attaching leads to respective conductive pads on a second side of the ceramic body;
attaching a first semiconductor die in a first interior portion of the ceramic body above the first plate;
attaching a second semiconductor die in a second interior portion of the ceramic body above the second plate;
electrically connecting a first component of the first semiconductor die and a second component of the second semiconductor die in a circuit; and
attaching a third plate to cover a third opening in the second side of the multilevel ceramic body.

16. The method of claim 15, further comprising:
attaching a first die attach pad on the first plate in the first interior portion of the ceramic body;
attaching a second die attach pad on the second plate in the second interior portion of the ceramic body;
attaching the first semiconductor die on the first die attach pad above the first plate; and
attaching the second semiconductor die on the second die attach pad above the second plate.

17. The method of claim 15, further comprising:
attaching a substrate on a ceramic separator structure of the ceramic body between the first and second interior portions; and
electrically connecting the first and second components in the circuit by bond wires connected to the substrate.

18. The method of claim 17, wherein electrically connecting the first and second components in the circuit includes:
connecting a first bond wire between a first conductive feature of the first semiconductor die and a first conductive pad of the substrate;
connecting a second bond wire between a first conductive feature of the second semiconductor die and the first conductive pad of the substrate;
connecting a third bond wire between a second conductive feature of the first semiconductor die and a second conductive pad of the ceramic body; and
connecting a fourth bond wire between a second conductive feature of the second semiconductor die and a third conductive pad of the ceramic body.

19. The method of claim 15, wherein electrically connecting the first and second components in the circuit includes performing a wirebonding process.

20. The method of claim 15, wherein attaching the third plate seals the first and second interior portions of the ceramic body.

* * * * *